(12) United States Patent
Ishikawa et al.

(10) Patent No.: US 7,639,755 B2
(45) Date of Patent: Dec. 29, 2009

(54) DISTORTION COMPENSATING APPARATUS

(75) Inventors: Hiroyoshi Ishikawa, Kawasaki (JP);
Tokuro Kubo, Kawasaki (JP); Kazuo Nagatani, Kawasaki (JP); Yasuyuki Oishi, Kawasaki (JP); Hajime Hamada, Kawasaki (JP); Nobukazu Fudaba, Kawasaki (JP); Toru Maniwa, Kawasaki (JP); Hiroyuki Hayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 567 days.

(21) Appl. No.: 10/951,040

(22) Filed: Sep. 22, 2004

(65) Prior Publication Data
US 2005/0047521 A1    Mar. 3, 2005

Related U.S. Application Data

(63) Continuation of application No. PCT/JP02/05323, filed on May 31, 2002.

(51) Int. Cl.
*H04K 1/02* (2006.01)
(52) U.S. Cl. .................................................. 375/296
(58) Field of Classification Search .................. 375/269
See application file for complete search history.

(56) References Cited

U.S. PATENT DOCUMENTS

| | | | |
|---|---|---|---|
| 5,870,668 A * | 2/1999 | Takano et al. | 455/126 |
| 6,081,698 A * | 6/2000 | Moriyama et al. | 455/126 |
| 6,091,941 A * | 7/2000 | Moriyama et al. | 455/126 |
| 6,275,685 B1 * | 8/2001 | Wessel et al. | 455/126 |
| 2001/0007435 A1 * | 7/2001 | Ode et al. | 330/149 |
| 2001/0051504 A1 * | 12/2001 | Kubo et al. | 455/63 |

FOREIGN PATENT DOCUMENTS

| | | |
|---|---|---|
| JP | 06-303045 | 10/1994 |
| JP | 09-064932 | 3/1997 |
| JP | 2000-40958 | 2/2000 |
| JP | 2000-216640 | 8/2000 |
| JP | 2001-284980 | 10/2001 |
| JP | 2001-345718 | 12/2001 |

OTHER PUBLICATIONS

International Search Report dated Jul. 16, 2002.
Supplementary European Search Report dated Jun. 24, 2005.

* cited by examiner

*Primary Examiner*—David C Payne
*Assistant Examiner*—Nader Bolourchi
(74) *Attorney, Agent, or Firm*—Katten Muchin Rosenman LLP

(57) ABSTRACT

A distortion compensating apparatus calculates a distortion compensation coefficient in such a manner that a difference signal between a reference signal, which is a transmit signal, and a feedback signal will be diminished, updates an old distortion compensation coefficient by the calculated distortion compensation coefficient and applies distortion compensation to the transmit signal based upon this distortion compensation coefficient. In this apparatus, a phase correcting interval, which is for correcting the phase difference between the reference signal and the feedback signal, and a distortion compensation coefficient updating interval are generated alternately, a correction is applied so as to null the phase difference in the phase correcting interval, and the distortion compensation coefficient is updated in the distortion compensation coefficient updating interval.

11 Claims, 27 Drawing Sheets

(a)

(b) (c)

DISTORTION COMPENSATING APPARATUS

CROSS-REFERENCE TO THE RELATED APPLICATION

The present application is a continuation of International Application No. PCT/JP02/05323 which was filed on May 31, 2002, which is herein incorporated by reference.

BACKGROUND OF THE INVENTION

This invention relates to a distortion compensating apparatus and, more particularly, to a distortion compensating apparatus having a distortion compensation coefficient calculating unit, to which is input a difference signal between a reference signal that is a transmit signal and a feedback signal, for calculating a distortion compensation coefficient from an adaptive algorithm in such a manner that the difference signal will be diminished, a distortion compensation coefficient memory the stored content of which is updated by the distortion compensation coefficient calculated, and a distortion compensator for applying distortion compensation to the transmit signal based upon the distortion compensation coefficient.

In wireless communications in recent years, there is growing use of high-efficiency transmission using digital techniques. In instances where multilevel phase modulation is applied to wireless communications, a vital technique is one which can suppress non-linear distortion by linearizing the amplification characteristic of the power amplifier on the transmitting side and reduce the leakage of power between adjacent channels. Also essential is a technique which compensates for the occurrence of distortion that arises when an attempt is made to improve power efficiency by using an amplifier that exhibits poor linearity.

FIG. 27 is a block diagram illustrating an example of a transmitting apparatus in a radio according to the prior art. Here a transmit-signal generator 1 transmits a serial digital data sequence and a serial/parallel (S/P) converter 2 splits the digital data sequence alternately one bit at a time to convert the data to two sequences, namely an in-phase component signal (also referred to as an "I signal") and a quadrature component signal (also referred to as a "Q signal"). A DA converter 3 converts the I and Q signals to respective analog baseband signals and inputs these to a quadrature modulator 4. The latter multiplies the input I and Q signals (the transmit baseband signals) by a reference carrier wave and a signal that has been phase-shifted relative to the reference carrier by 90°, respectively, and adds the results of multiplication to thereby perform quadrature modulation and output the modulated signal. A frequency converter 5 mixes the quadrature-modulated signal and a local oscillation signal to thereby effect a frequency conversion, and a transmission power amplifier 6 power-amplifies the carrier output from the frequency converter 5. The amplified signal is released into space from an antenna 7.

In mobile communications based upon W-CDMA, etc., the transmission power of the transmitting apparatus is a high 10 mW to several tens of watts, and the input/output characteristic [distortion function f(p)] of the transmission power amplifier 6 is non-linear, as indicated by the dotted line at (a) of FIG. 28. Non-linear distortion arises as a result of this non-linear characteristic, and the frequency spectrum in the vicinity of a transmission frequency $f_0$ comes to exhibit side lobes, as indicated by the solid line in (b) of FIG. 28, leakage into adjacent channels occurs and this causes interference between adjacent channels. More specifically, owing to non-linear distortion, there is an increase in power that causes transmitted waves to leak into the adjacent frequency channels, as shown in at (b) in FIG. 28. ACPR (Adjacent Channel Power Ratio), which indicates the magnitude of leakage power, is the ratio between the power of the channel of interest, which is the area of the spectrum between the one-dot chain lines A and A' at (b) in FIG. 28, and the adjacent leakage power, which is the area of the spectrum between the two-dot chain lines B and B', that leaks into the adjacent channel. Such leakage power constitutes noise in other channels and degrades the quality of communication of these channels. Such leakage must be limited to the utmost degree.

Leakage power is small in the linear region [see (a) in FIG. 28] of a power amplifier and large in the non-linear region. Accordingly, it is necessary to broaden the linear region in order to obtain a transmission power amplifier having a high output. However, this necessitates an amplifier having a performance higher than that actually needed and therefore is inconvenient in terms of cost and apparatus size. Accordingly, a radio apparatus that has come to be adopted is equipped with a distortion compensating function that compensates for distortion of the transmission power.

FIG. 29 is a block diagram of a transmitting apparatus having a digital non-linear distortion compensating function that employs a DSP (Digital Signal Processor). Here a group of digital data (a transmit signal) sent from the transmit-signal generator 1 is converted to two signal sequences, namely I and Q signals, by the S/P converter 2, and these signals enter a distortion compensator 8 constituted by a DSP. The distortion compensator 8 has a distortion compensation coefficient memory 8a for storing distortion compensation coefficients h(pi) (i=0~1023) conforming to power levels pi of a transmit signal x(t); a predistortion unit 8b for subjecting the transmit signal to distortion compensation processing (predistortion) using a distortion compensation coefficient h(pi) that is in conformity with the level of the transmit signal; and a distortion compensation coefficient calculation unit 8c for comparing the transmit signal x(t) with a demodulated signal (feedback signal) y(t), which has been obtained by demodulation in a quadrature detector described later, and for calculating and updating the distortion compensation coefficient h(pi) in such a manner that the difference between the compared signals will approach zero.

The signal that has been subjected to predistortion processing in the distortion compensator 8 is input to the DA converter 3. The latter converts the input I and Q signals to analog baseband signals and applies the baseband signals to the quadrature modulator 4. The latter multiplies the input I and Q signals by a reference carrier wave and a signal that has been phase-shifted relative to the reference carrier by 90°, respectively, and sums the results of multiplication to thereby perform quadrature modulation and output the modulated signal. The frequency converter 5 mixes the quadrature-modulated signal and a local oscillation signal to thereby effect a frequency conversion, and the transmission power amplifier 6 power-amplifies the carrier signal output from the frequency converter 5. The amplified signal is released into the atmosphere from the antenna 7.

Part of the transmit signal is input to a frequency converter 10 via a directional coupler 9, whereby the signal undergoes a frequency conversion and is input to a quadrature detector 11. The latter performs quadrature detection by multiplying the input signal by a reference carrier wave and a signal that has been phase-shifted relative to the reference carrier by 90°, reproduces the I, Q signals of the baseband on the transmitting side and applies these signals to an AD converter 12. The latter converts the applied I and Q signals to digital data and inputs the digital data to the distortion compensator 8. By way of adaptive signal processing using the LMS (Least Mean Square) algorithm, the distortion compensator 8 compares the transmit signal before distortion compensation with the feedback signal demodulated by the quadrature detector 11 and proceeds to calculate and update the distortion compensation coefficient h(pi) in such a manner that the difference between the compared signals will become zero. By thenceforth repeating this operation, non-linear distortion of the transmission power amplifier 6 is suppressed to reduce the leakage of power between adjacent channels.

FIG. 30 is a diagram useful in describing distortion compensation processing by an adaptive LMS. Reference numeral 15a denotes a multiplier (which corresponds to the predistortion unit 8b in FIG. 29) for multiplying the transmit signal x(t) by a distortion compensation coefficient $h_{n-1}(p)$. Reference numeral 15b represents a transmission power amplifier having a distortion function f(p). Reference numeral 15c denotes a feedback loop for sending back the output signal y(t) from the transmission power amplifier. Reference numeral 15d denotes an arithmetic unit (amplitude-to-power converter) for calculating the power p $[=x(t)^2]$ of the transmit signal x(t). Reference numeral 15e represents a distortion compensation coefficient memory (which corresponds to the distortion compensation coefficient memory 8a of FIG. 29) 15e for storing the distortion compensation coefficients that conform to the power levels of the transmit signal x(t). The memory 15e outputs the distortion compensation coefficient $h_{n-1}(p)$ conforming to the power p of the transmit signal x(t) and updates the distortion compensation coefficient $h_{n-1}(p)$ by a distortion compensation coefficient $h_n(p)$ found by the LMS algorithm.

Reference numeral 15f denotes a complex-conjugate signal output unit, 15g a subtractor that outputs the difference e(t) between the transmit signal x(t) and the feedback demodulated signal y(t), 15h a multiplier that performs multiplication between e(t) and u*(t), 15i a multiplier that performs multiplication between $h_{n-1}(p)$ and y*(t), 15j a multiplier that performs multiplication by a step-size parameter μ, and 15k an adder that adds $h_{n-1}(p)$ and μe(t)u*(t). Reference numerals 15m, 15n, 15p denote delay units. A delay time D, which is equivalent to the length of time from the moment the transmit signal x(t) enters to the moment the feedback (demodulated) signal y(t) is input to the subtractor 15g, is added onto the input signal.

Reference numerals 15f and 15h~15j construct a rotation calculation unit 16. A signal that has sustained distortion is indicated at u(t). The delay time D set in the delay units 15m, 15n, 15p is decided so as to satisfy $D=D_0+D_1$, where $D_0$ represents the delay time in the transmission power amplifier 15b and $D_1$ the delay time of the feedback loop 15c. If the delay time D cannot be set correctly, the distortion compensating function will not operate effectively. Further, the larger the setting error of the delay time, the larger the sidelobes and the greater the leakage power to adjacent channels.

The arithmetic operations performed by the arrangement set forth above are as follows:

$$h_n(p)=h_{n-1}(p)+\mu e(t)u^*(t)$$

$$e(t)=x(t)-y(t)$$

$$y(t)=h_{n-1}(p)x(t)f(p)$$

$$u(t)=x(t)f(p)=h^*_{n-1}(p)y(t)$$

$$P=|x(t)|^2$$

where x, y, f, h, u, e represent complex numbers and * signifies a complex conjugate. By executing the processing set forth above, the distortion compensation coefficient h(p) is updated so as to minimize the difference e(t) between the transmit signal x(t) and the feedback demodulated signal y(t), and the coefficient eventually converges to the optimum distortion compensation coefficient so that compensation is made for the distortion in the transmission power amplifier. FIG. 31 is a diagram showing the overall structure of a transmitting apparatus expressed by x(t)=I(t)+jQ(t). Components in FIG. 31 identical with those shown in FIGS. 29 and 30 are designated by like reference characters.

As mentioned above, the principle of a distortion compensating apparatus is to feed back and detect a carrier obtained by quadrature modulation of a transmit signal, digitally convert and compare the amplitudes of the transmit signal and feedback signal, and update the distortion compensation coefficient in real time based upon the result of the comparison. In accordance with this method of non-linear distortion compensation, distortion can be reduced. As a result, leakage power can be kept low even with operation at high output and in a non-linear region, and it is possible to improve power load efficiency.

Even if the delay time D is set correctly so as to satisfy $D=D_0+D_1$, there are instances where a favorable, stabilized distortion compensation operation cannot be obtained and unnecessary out-of-band power is produced. The cause is clock jitter produced by thermal noise and other disturbances in the analog system that includes the AD and DA converters. When clock jitter occurs, the phase of the feedback signal fluctuates violently and this has an influence upon convergence of distortion compensation coefficient.

Owing to jitter, clock speed changes repeatedly, sometimes attaining a high speed and sometimes a low speed. Consequently, the phase difference of the feedback signal relative to the reference signal varies, as illustrated in FIG. 32 by way of example. With the conventional distortion compensating apparatus, phase fluctuation due to clock jitter is not taken into consideration. As a result, the distortion compensation coefficient undergoes unstable fluctuation within the range of phase fluctuation. Since the distortion compensation coefficient is multiplied by the transmit signal, this brings about the generation of unwanted waves.

SUMMARY OF THE INVENTION

Accordingly, an object of the present invention is to so arrange it that a favorable, stabilized distortion compensating operation can be performed even if the phase difference between a reference signal and a feedback signal fluctuates owing to jitter or the like.

A distortion compensating apparatus according to the present invention comprises: a distortion compensation coefficient calculating unit, to which is input a difference signal between a reference signal that is a transmit signal and a feedback signal, for calculating a distortion compensation coefficient from an adaptive algorithm in such a manner that the difference signal will be diminished; a distortion compensation coefficient memory the stored content of which is updated by the distortion compensation coefficient calculated; a distortion compensator for applying distortion compensation to the transmit signal based upon the distortion compensation coefficient; a phase-difference detector for detecting a phase difference between the reference signal and the feedback signal; a phase correcting unit for correcting the phase difference; and a controller for exercising control so as to alternately generate a phase correcting interval and a distortion compensation coefficient updating interval, correct the phase difference in the phase correcting internal and update the distortion compensation coefficient in the distortion compensation coefficient updating interval.

In accordance with this distortion compensating apparatus, the phase difference between the reference signal and the feedback signal is corrected periodically and the distortion compensation coefficient is updated only in an interval in which the phase difference is small. The distortion compensation coefficient can be made to converge rapidly, therefore, without being affected by the phase difference. As a result, a favorable, stabilized distortion compensating operation can be performed even if the phase difference between the reference signal and the feedback signal fluctuates.

Further, phase difference cannot be detected correctly if the amplitude of the reference signal is zero or below the noise level. If the reference signal is less than a set value, therefore, updating of the distortion compensation coefficient is halted. If this arrangement is adopted, the distortion compensation coefficient will not be updated to an erroneous value. When the reference signal takes on a large value, therefore, distortion compensation control can be carried out immediately using the correct distortion compensation coefficient.

Further, the distortion compensation coefficient updating interval is lengthened if the phase difference between the reference signal and the feedback signal is small and is shortened if the phase difference is large. If this arrangement is adopted, the updating interval can be lengthened if the phase difference is small, and therefore the distortion compensation coefficient can be made to converged rapidly. If the phase difference is large, the distortion compensation coefficient updating interval can be shortened. This means that updating of the distortion compensation coefficient can be performed only in an interval in which the phase difference is small owing to a correction. It should be noted that the distortion compensation coefficient updating interval can also be decided based upon the size of the difference signal between the reference signal and the feedback signal, the magnitude of adjacent-channel power or the state of convergence of the distortion compensation coefficient.

Further, an effect equivalent to a case where the distortion compensation coefficient updating interval is controlled is produced by controlling an updating time constant of distortion compensation coefficients in the distortion compensation coefficient calculating unit based upon the size of the phase difference between the reference signal and the feedback signal. For example, if the phase difference between the reference signal and the feedback signal is small, the updating time constant is reduced to equivalently lengthen the distortion compensation coefficient updating interval. If the phase difference between the reference signal and the feedback signal is large, then the updating time constant is enlarged to equivalently shorten the distortion compensation coefficient updating interval.

BRIEF DESCRIPTION OF THE DRAWINGS

DESCRIPTION OF THE PREFERRED EMBODIMENTS (A) Principles of the Present Invention FIG. 1 is a diagram for describing the principles of the present invention. Assume that a phase difference φ of the kind indicated at A is being produced between a reference signal and a feedback signal owing to clock jitter. In this case, even if the phase difference φ between the reference signal and the feedback signal is detected and an attempt is made to correct the phase difference, the phase correction cannot follow up a high-speed fluctuation in phase ascribable to clock jitter. Even if the phase correction is performed and a table of distortion compensation coefficients updated, therefore, the distortion compensation coefficients will not converge stably owing to the influence of a phase difference φ$_{pp}$, and a favorable distortion compensating operation will be difficult to achieve.

Accordingly, in the present invention, ①a phase correcting interval Δt and a distortion compensation coefficient updating interval ΔT are generated alternately, ② the phase difference φ between the reference signal and the feedback signal is corrected in the phase correcting interval Δt, and ③ the distortion compensation coefficients are updated in the distortion compensation coefficient updating interval ΔT, and this operation is subsequently repeated. Specifically, in the phase correcting interval Δt, the phase difference φ is measured n times and averaged, and phase is corrected based upon the average phase difference. In the distortion compensation coefficient updating interval ΔT, in which the phase difference has been diminished owing to the correction, the distortion compensation coefficient is updated clock by clock. It is considered that the distortion compensation coefficient updating interval ΔT will be sufficiently shorter than period of phase fluctuation.

Thus, the present invention repeatedly performs the operation of ① correcting the phase difference between the reference signal and the feedback signal; ② updating the distortion compensation coefficient in an interval in which the phase difference has been diminished by the phase correction; ③, halting the updating of distortion compensation coefficient and correcting the phase difference instead if the phase difference is large; and ④ subsequently updating the distortion compensation coefficient. With the present invention, therefore, the only influence is from the phase difference of Δφ, and the distortion compensation coefficient can be made to converge rapidly without being influenced by the phase difference.

Further, the distortion compensation coefficient updating interval is decided based upon the phase difference between the reference signal and the feedback signal prior to the phase-difference correction. For example, in a case where the phase difference between the reference signal and the feedback signal is small, as indicated at B, the distortion compensation coefficient updating interval ΔT is lengthened. If the phase difference is large, as indicated at C, the distortion compensation coefficient updating interval ΔT is shortened. If this arrangement is adopted, the updating interval can be lengthened when the phase difference is small, as a result of which the distortion compensation coefficient can be made to converge rapidly. If the phase difference is large, then the distortion compensation coefficient updating interval can be shortened. As a result, the distortion compensation coefficient can be updated only in an interval in which the phase difference has been diminished by correction.

(B) First Embodiment

Figure 2:
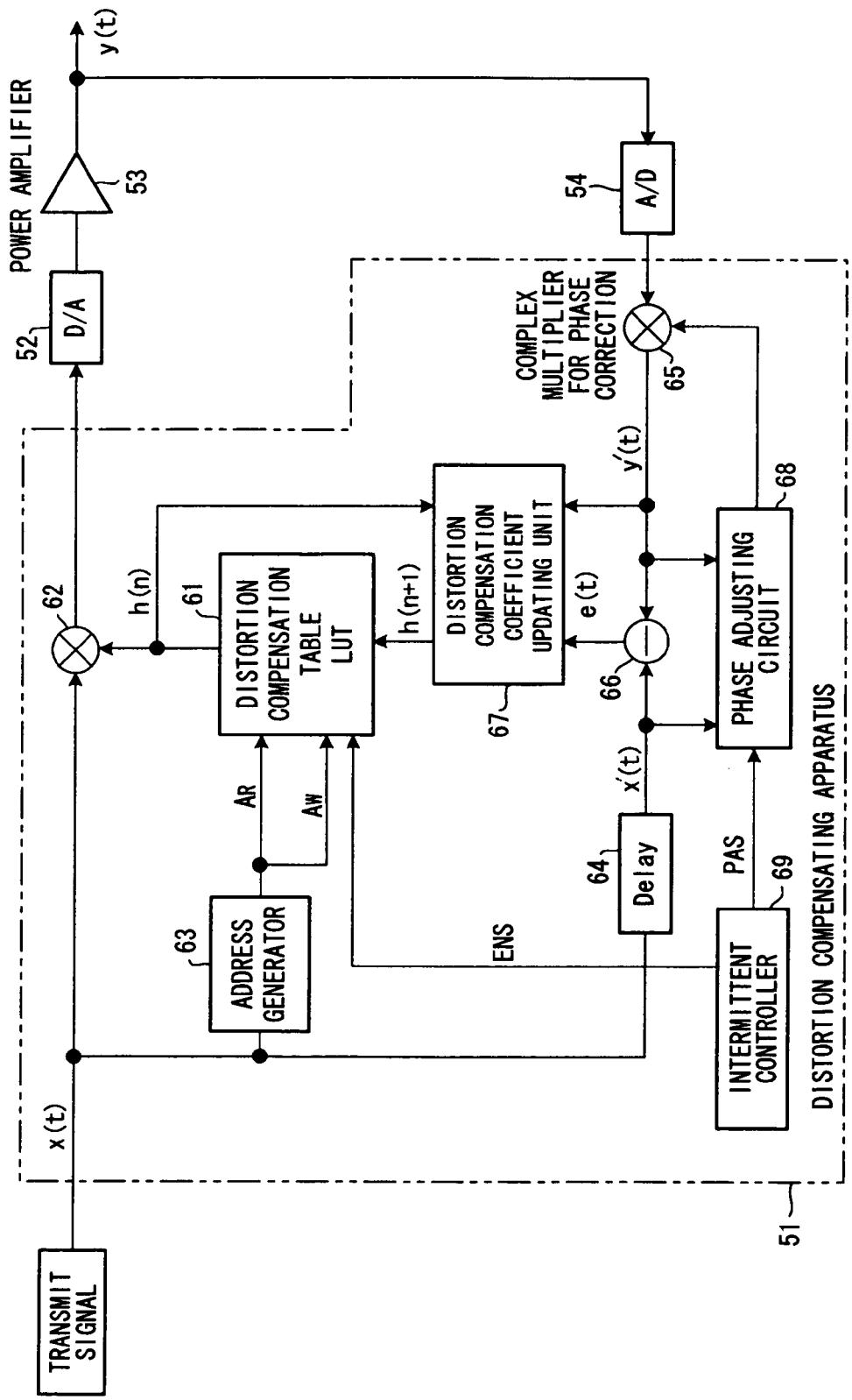
FIG. 2 is a block diagram of a distortion compensating apparatus according to a first embodiment.

FIG. 2 is a block diagram of a distortion compensating apparatus according to a first embodiment.

A group of digital data (a transmit signal) sent from a transmit-signal generator (not shown) is subjected to distortion compensation processing by a distortion compensating apparatus 51 and then input to a DA converter 52. The latter converts the digital transmit signal to an analog signal and inputs the analog signal to a power amplifier 53 directly or via a quadrature modulator and frequency converter, which are not shown. The power amplifier 53 amplifies the input signal and the amplified signal is released into the atmosphere from an antenna. The output of the power amplifier 53 is input to an AD converter 54 directly or via a frequency converter or quadrature demodulator, which are not shown. The AD converter 54 converts the input signal to a digital signal and inputs the digital signal to the distortion compensating apparatus 51.

In the distortion compensating apparatus 51, a distortion compensation table (LUT) 61 stores a number of distortion compensation coefficients h(n) that conform to the power of the transmit signal x(t), and a multiplier 63 multiplies the distortion compensation coefficient h(n) conforming to the power of the transmit signal by the transmit signal to thereby apply distortion compensation processing.

An address generator 63 generates a readout address A$_R$ that conforms to the power of the transmit signal x(t), reads the distortion compensation coefficient h(n) that conforms to this power out of the distortion compensation table 61 and inputs it to a multiplier 62. Further, the address generator 63 generates a write address A$_W$ and writes a distortion compensation coefficient h(n+1), which has been calculated by a distortion compensation coefficient updating unit 67, to the distortion compensation table 61, thereby updating the table. A delay circuit 64 delays the input signal for a period of time from entry of the transmit signal x(t) to entry of a feedback signal y(t) to a subtractor 66 and outputs a reference signal x'(t).

A complex multiplier 65 corrects the phase of the feedback signal y(t) so as to null the phase difference between the reference signal x'(t) and the feedback signal that is the output of the AD converter 54. The subtractor 66 calculates a difference signal e(t) between the reference signal x'(t) and the phase-corrected feedback signal y'(t), and the distortion compensation coefficient updating unit 67, to which the difference signal e(t) is input, calculates the distortion compensation coefficient h(n+1) by an adaptive algorithm so as to reduce the difference signal and updates the content h(n) of the distortion compensation table 61.

A phase adjusting circuit 68 detects a phase difference φ between the reference signal x'(t) and the feedback signal y'(t) and inputs the phase difference to the complex multiplier 65. An intermittent controller 69 exercises control in such a manner that the phase correcting interval Δt and the distortion compensation coefficient updating interval ΔT are generated alternately and such that phase correction processing is executed in alternation with processing for updating distortion compensation coefficient.

Figure 3:
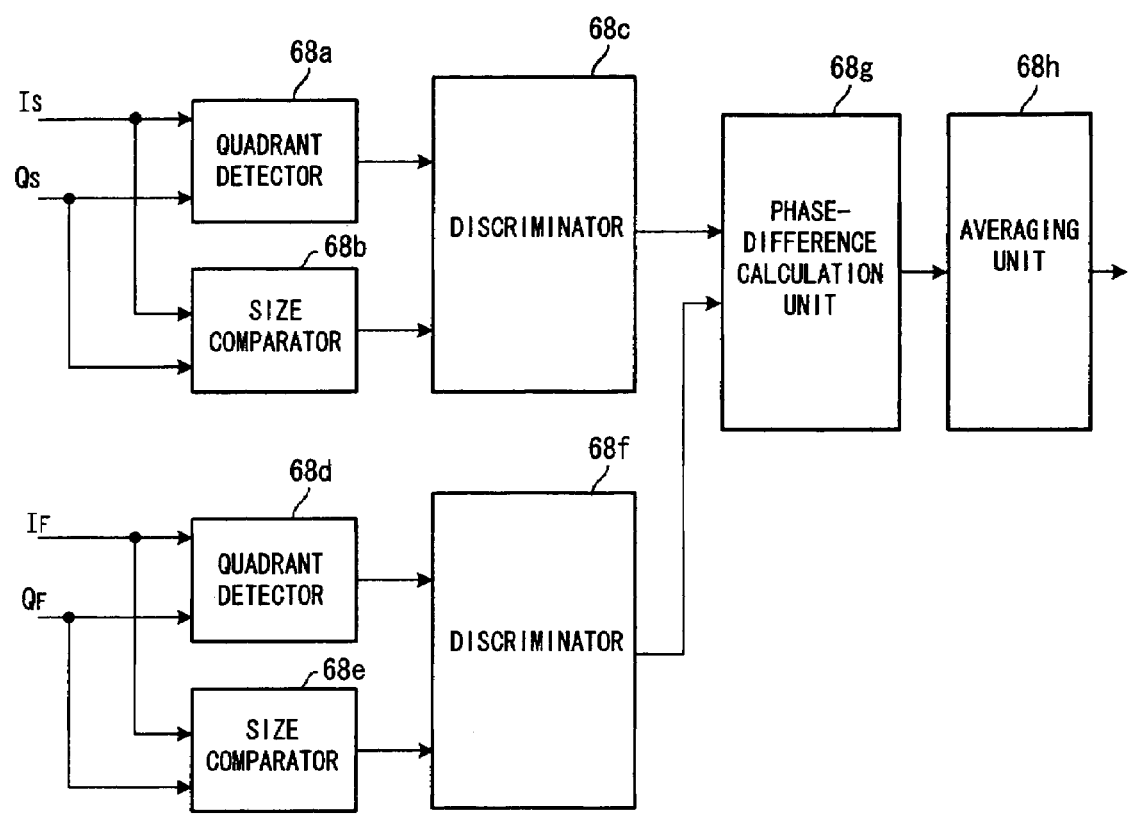
FIG. 3 is a block diagram of a phase-difference detector in a phase adjusting circuit.
Figure 4:
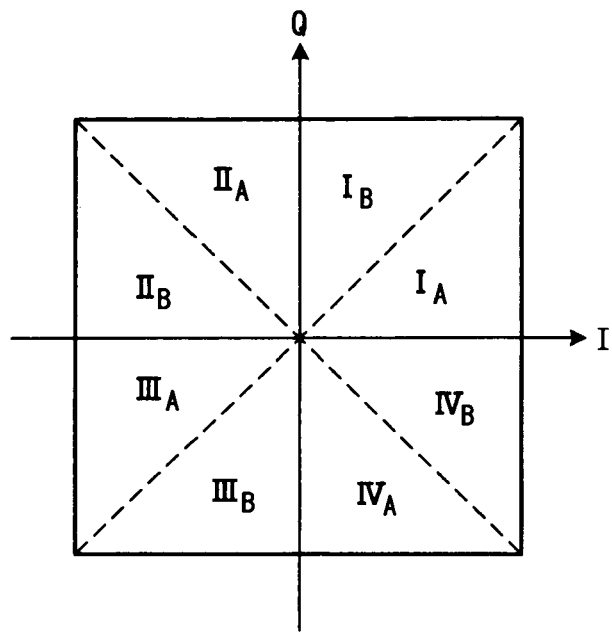
FIG. 4 is a diagram useful in describing calculation of phase difference.
Figure 31:
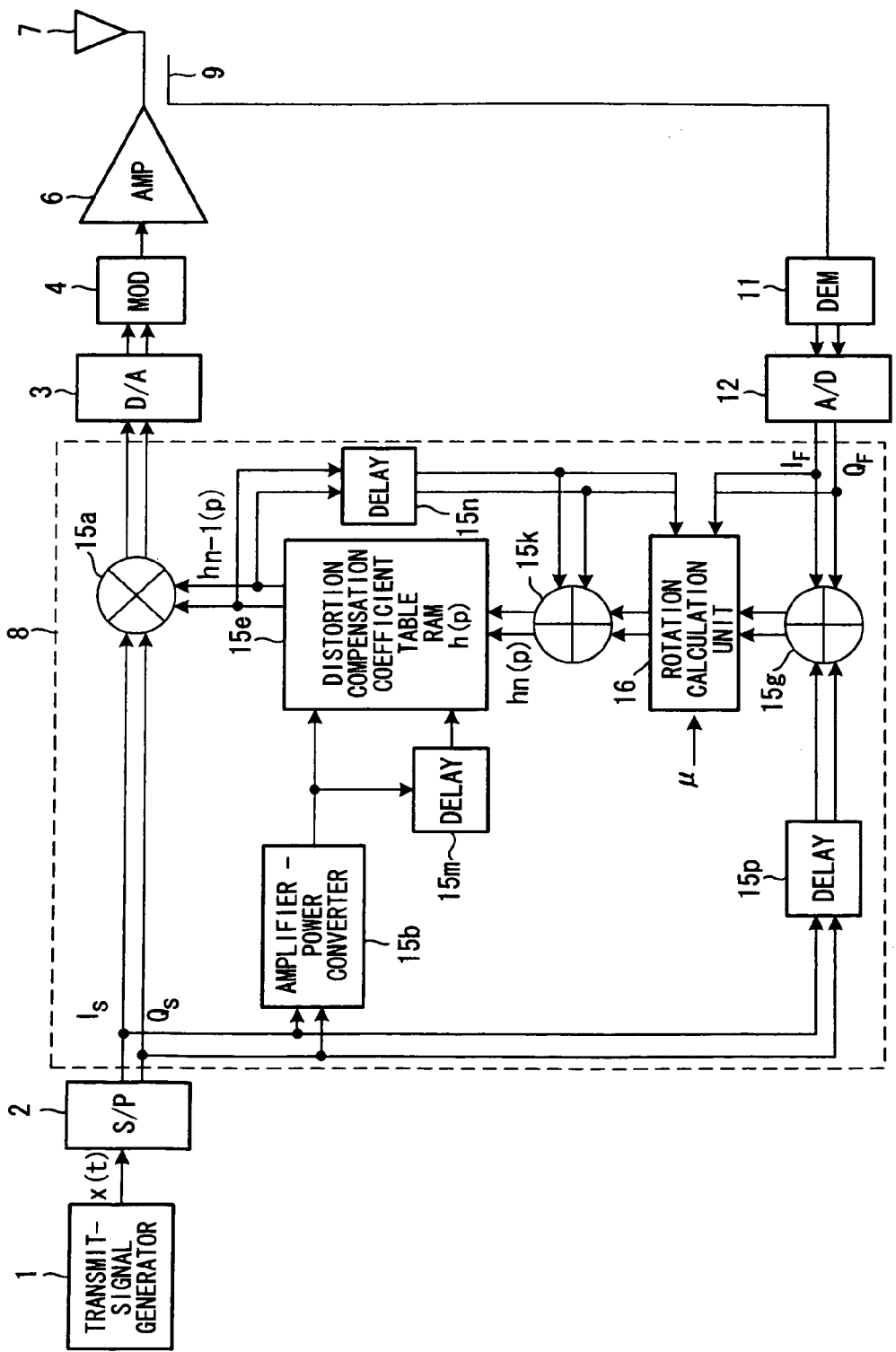
FIG. 31 is a diagram showing the overall construction of a transmitter expressed as $x(t)=I(t)+jQ(t)$ according to the prior art.
Figure 32:
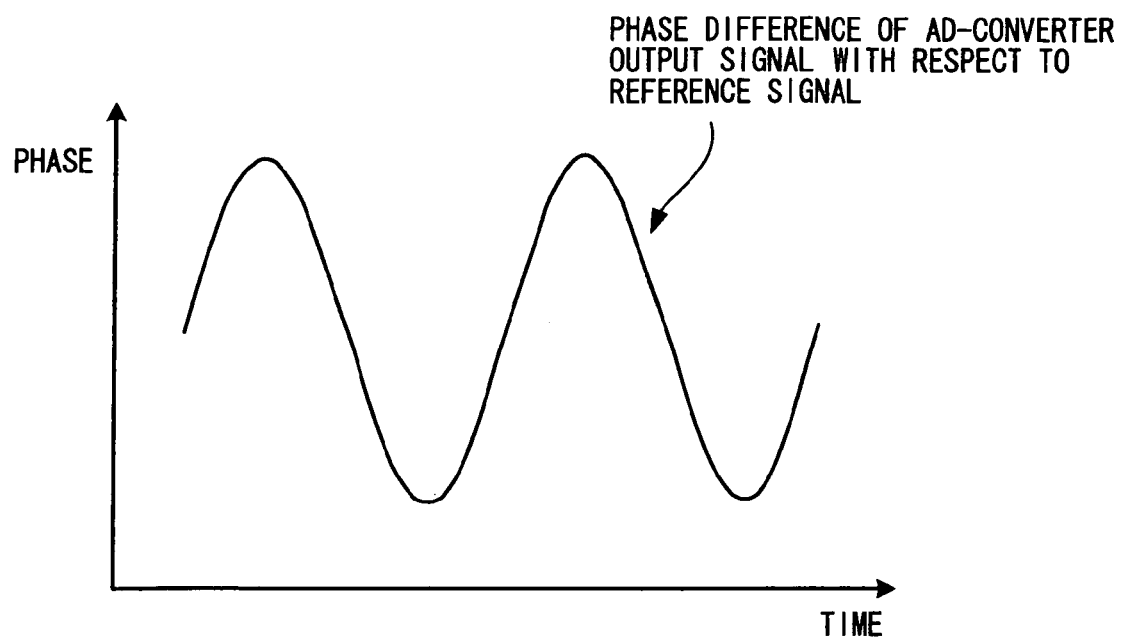
FIG. 32 is a diagram useful in describing phase difference of a feedback signal relative to a reference signal.

FIG. 3 is a block diagram of the phase-difference detector in the phase adjusting circuit 68. Though not specifically shown in FIG. 2, the transmit signal x(t) and feedback signal y(t) are complex signals (see FIG. 31) that can be expressed as follows:

$$x(t)=I_S+jQ_S$$

$$y(t)=I_F+jQ_F$$

A quadrant detector 68a detects a quadrant in which the transmit signal x(t) exists, and a size comparator 68b compares the real-number part and the imaginary-number part. On the basis of the quadrant in which the transmit signal x(t) is present and the result of the size comparison, a discriminator 68c, which is for discriminating the angular range in which a vector exists, discriminates in which section the signal is present, the sections being obtained by delimiting in increments of 45° (see FIG. 31). Similarly, a quadrant detector 68d detects a quadrant in which the feedback signal y(t) exists, and a size comparator 68e compares the real-number part and the imaginary-number part. On the basis of the quadrant in which the feedback signal y(t) is present and the result of the size comparison, a discriminator 68f, which is for discriminating the angular range in which a vector exists, discriminates in which section the signal is present, the sections being obtained by delimiting in increments of 45°. A phase-difference calculation unit 68g calculates phase difference in 45° units based upon the sections in which the transmit signal x(t) and feedback signal y(t) reside. For example, if it is assumed that the transmit signal x(t) is present in section $I_A$ and that the feedback signal y(t) is present in section $II_A$, then the phase difference will be 90°. An averaging unit 68h calculates the average value of the phase differences calculated by the phase-difference calculation unit 68g in the phase correcting interval and sets the average phase difference in the complex multiplier 65.

It should be noted that the phase of the transmit-signal vector can be calculated by $\tan^{-1}(Q_S/I_S)$, that the phase of the feedback-signal vector can be calculated by $\tan^{-1}(Q_F/I_F)$, and that the phase difference can be calculated from this difference between these. If the phase difference is $\Delta\phi$, then the feedback signal is multiplied by $\exp(-j\Delta\phi)$ to effect a phase correction.

Figure 5:
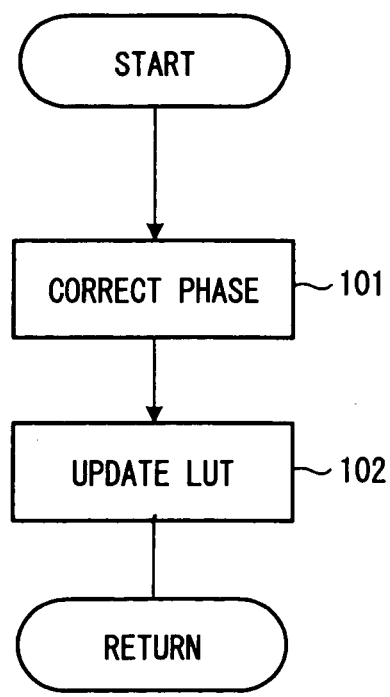
FIG. 5 is a flowchart of processing of intermittent control according to the first embodiment.

FIG. 5 is a flowchart of processing of intermittent control according to the first embodiment.

Figure 1:
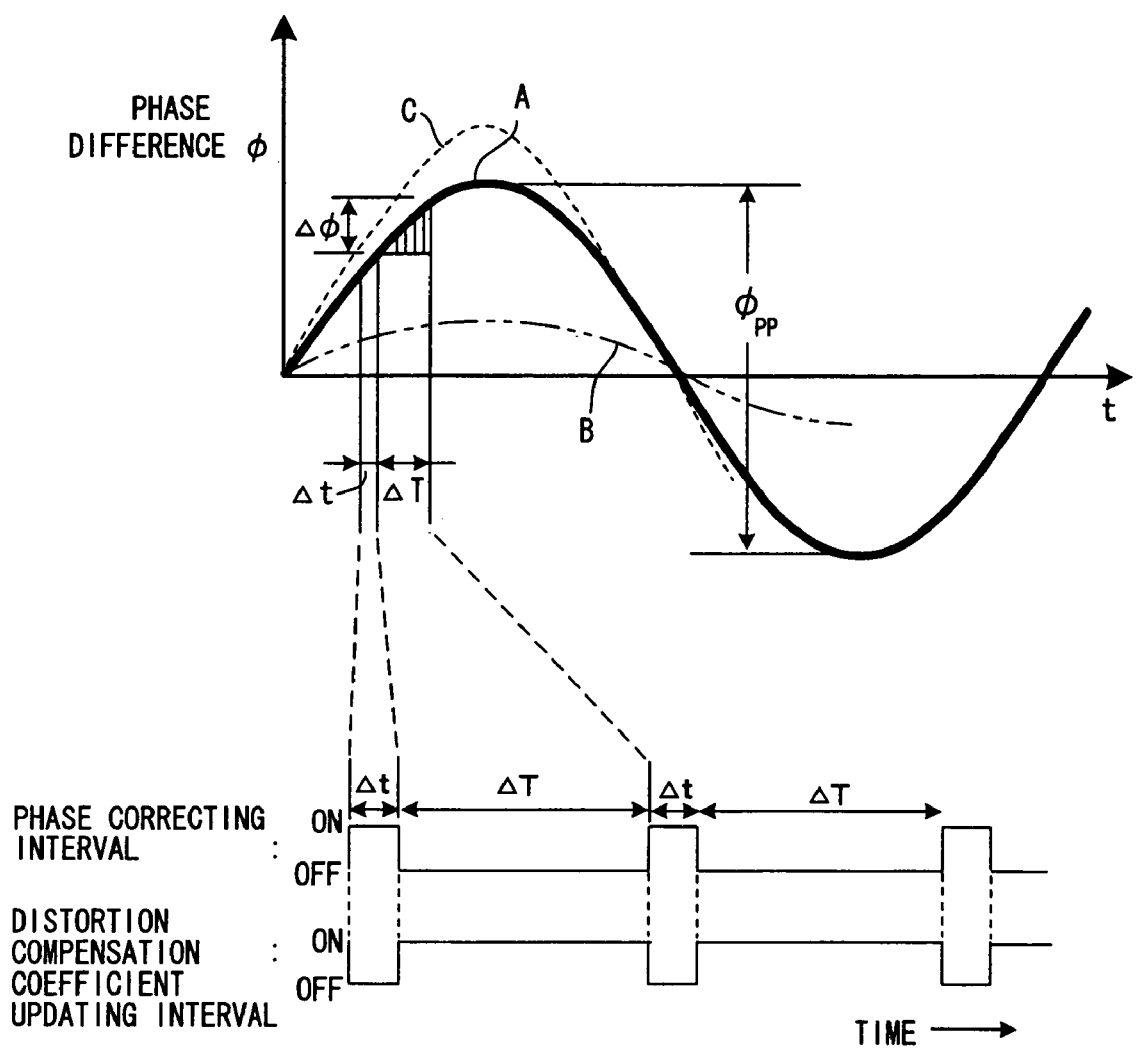
FIG. 1 is a diagram useful in describing the principles of the present invention.

The intermittent controller 69 exercises control so as to generate the phase correcting interval $\Delta t$ and the distortion compensation coefficient updating interval $\Delta T$ alternately, as shown in FIG. 1, and execute phase correction processing (step 101) and distortion compensation coefficient update processing (step 102) alternately. That is, in the phase correcting interval $\Delta t$ of step 101, the intermittent controller 69 places a phase adjusting on/off signal PAS at the high level and places an enable signal ENS for enabling the distortion compensation table (LUT) 61 at the low level. As a result, in the phase correcting interval $\Delta t$, the phase adjusting circuit 68 measures the phase difference $\phi$ between the reference signal x'(t) and the feedback signal y'(t) and sets it in the complex multiplier 65, and the latter applies a phase correction to the feedback signal so as to null the phase difference $\phi$. It should be noted that the distortion compensation table (LUT) 61 does not update the stored content in the phase correcting interval $\Delta t$.

On the other hand, in the distortion compensation coefficient updating interval $\Delta T$ of step 102, the intermittent controller 69 places the phase adjusting on/off signal PAS at the low level and places the enable signal ENS for enabling the distortion compensation table (LUT) 61 at the high level. As a result, in the distortion compensation coefficient updating interval $\Delta T$, the distortion compensation table 61 updates the old distortion compensation coefficient h(n) at the clock period by the distortion compensation coefficient h(n+1) calculated by the distortion compensation coefficient updating unit 67. It should be noted that the phase adjusting circuit 68 halts control for adjusting phase.

In accordance with the first embodiment, the phase difference between the reference signal and the feedback signal is corrected periodically and the distortion compensation coefficient is updated only in the interval in which the phase difference is small. The distortion compensation coefficient can be made to converge rapidly, therefore, without being affected by the phase difference. As a result, a favorable, stabilized distortion compensating operation can be performed even if the phase difference between the reference signal and the feedback signal fluctuates.

(C) Second Embodiment

Figure 6:
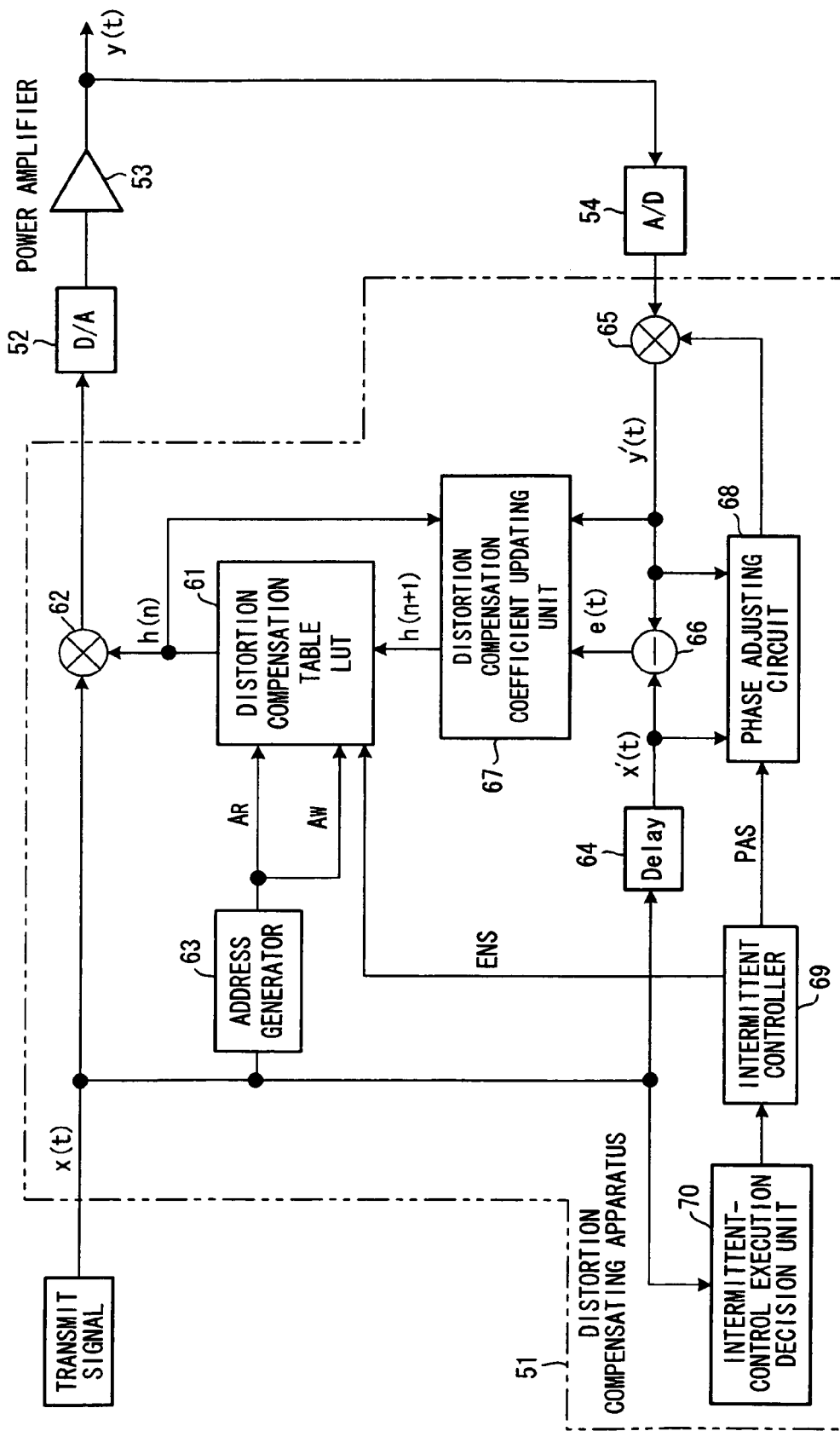
FIG. 6 is a block diagram of a distortion compensating apparatus according to a second embodiment.

FIG. 6 is a block diagram of a distortion compensating apparatus according to a second embodiment. Components identical with those of the first embodiment of FIG. 2 are designated by like reference characters. This embodiment differs in that an intermittent-control execution decision unit 70 is provided for determining whether or not intermittent control is to be performed.

In a case where the transmit signal has a large gap (i.e., is a special signal in which a signal of amplitude zero has been inserted intermittently) or has an amplitude that is on the order of the noise level, the phase adjusting circuit 68 can no longer correctly detect the phase difference between the reference signal and the feedback signal. In such case it is better to halt the phase correction or updating of the distortion compensation coefficient.

Figure 7:
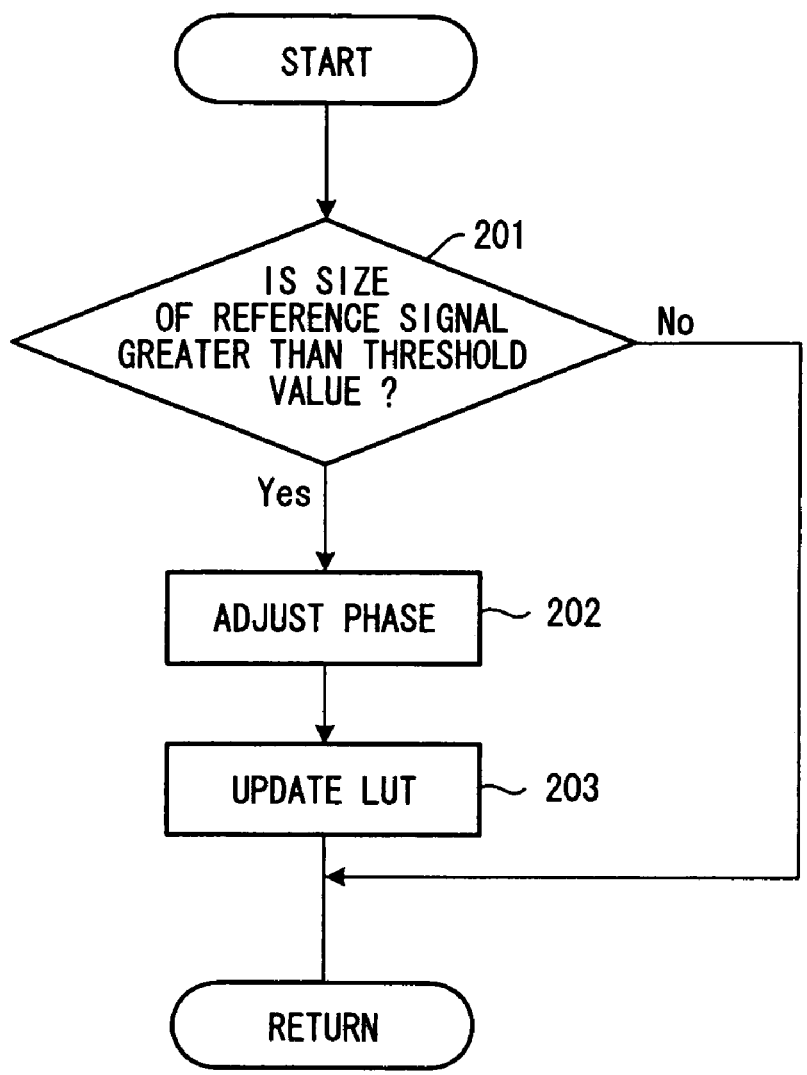
FIG. 7 is a flowchart of processing according to the second embodiment.

FIG. 7 is a flowchart of processing according to the second embodiment. In the second embodiment, the intermittent-control execution decision unit 70 detects the size of the transmit signal x(t), checks to see whether the transmit signal x(t) is greater than a set value (step 201) and, if transmit signal is greater than the set value, executes phase correction processing (step 202) and processing (step 203) for updating the distortion compensation table (LUT) in a manner similar to that of the first embodiment. However, if the transmit signal x(t) is found to be less than the set value at step 201, then the intermittent-control execution decision unit halts the phase correction and the updating of the distortion compensation coefficient and waits for the transmit signal x(t) to become equal to or greater than the set value.

The sensing of the gap signal mentioned above may be performed using the feedback signal y(t) instead of the transmit signal x(t).

In accordance with the second embodiment, the distortion compensation coefficient will not be updated to an erroneou values. When the reference signal takes on a large value, therefore, distortion compensation control can be carried out immediately using the correct distortion compensation coefficient.

Modification

In the second embodiment of FIG. 6, the updating of distortion compensation coefficients is halted when the amplitude of the transmit signal falls below the set value. However, it can be so arranged that the updating of distortion compensation coefficients is halted based upon the amount of fluctuation in phase difference between the present phase difference and the preceding phase difference calculated by the phase adjusting circuit 68. The reason for this is as follows: The fact that phase will not act correctly if a large signal gap is produced was described in the second embodiment. This means that in the gap segment of the transmit signal, the phase difference will clearly differ from the usual value. For example, there will be a violent fluctuation in the phase difference calculated by the phase adjusting circuit 68. Accordingly, if the phase difference calculated by the phase adjusting circuit 68 is monitored and the amount of fluctuation in this phase difference exceeds a set value, then it is judged that there is a gap in the transmit signal and control is exercised so as not to update the distortion compensation table LUT.

Figure 8:
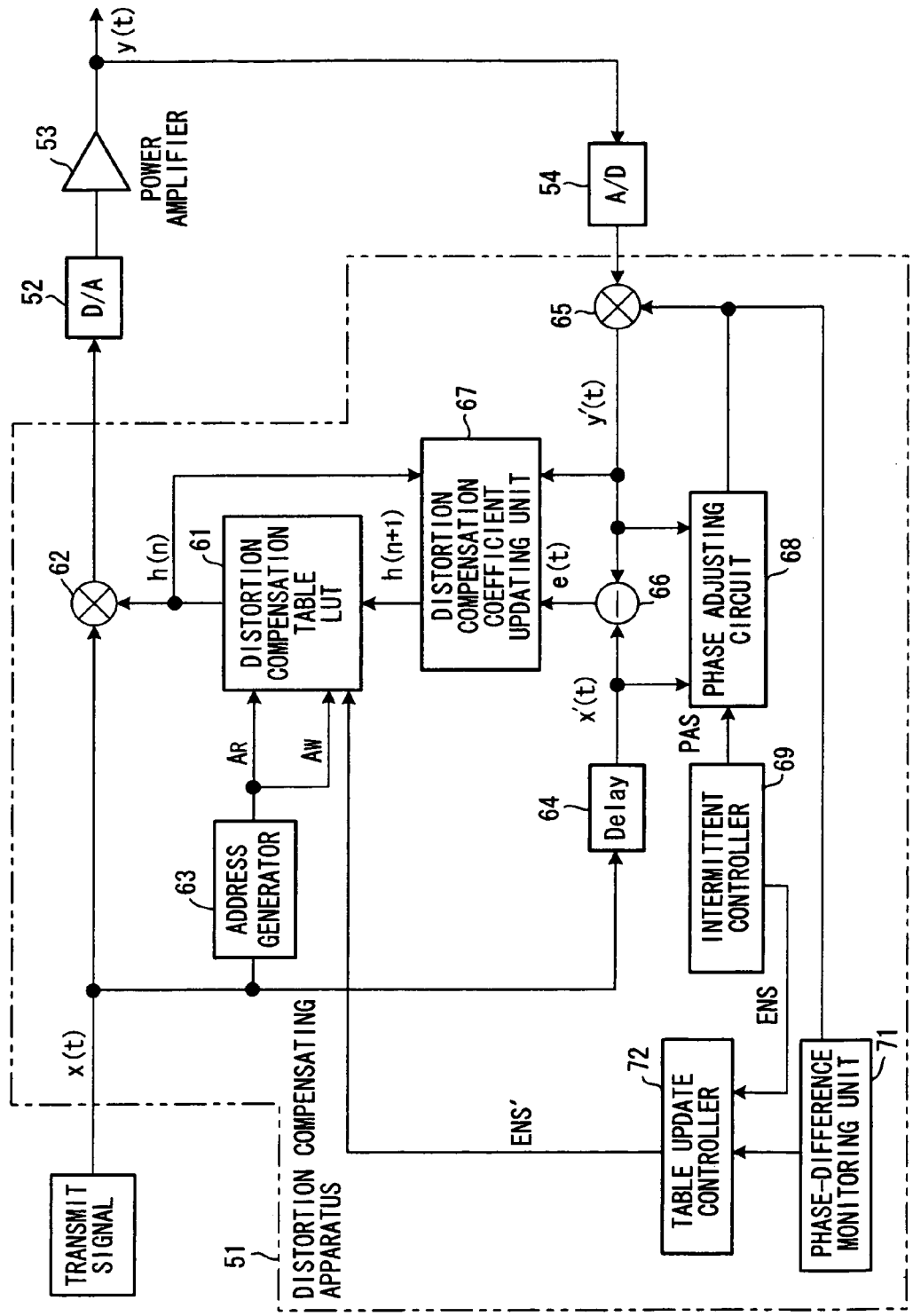
FIG. 8 shows an example of a modification of the second embodiment.

FIG. 8 is a modification of the second embodiment. Components identical with those of the second embodiment of FIG. 6 are designated by like reference characters. This modification differs in that it is provided with a phase-difference monitoring unit 71 for monitoring a fluctuation in the phase difference calculated by the phase adjusting circuit 68, and a table update controller 72 for controlling updating of the distortion compensation table (LUT).

Figure 9:
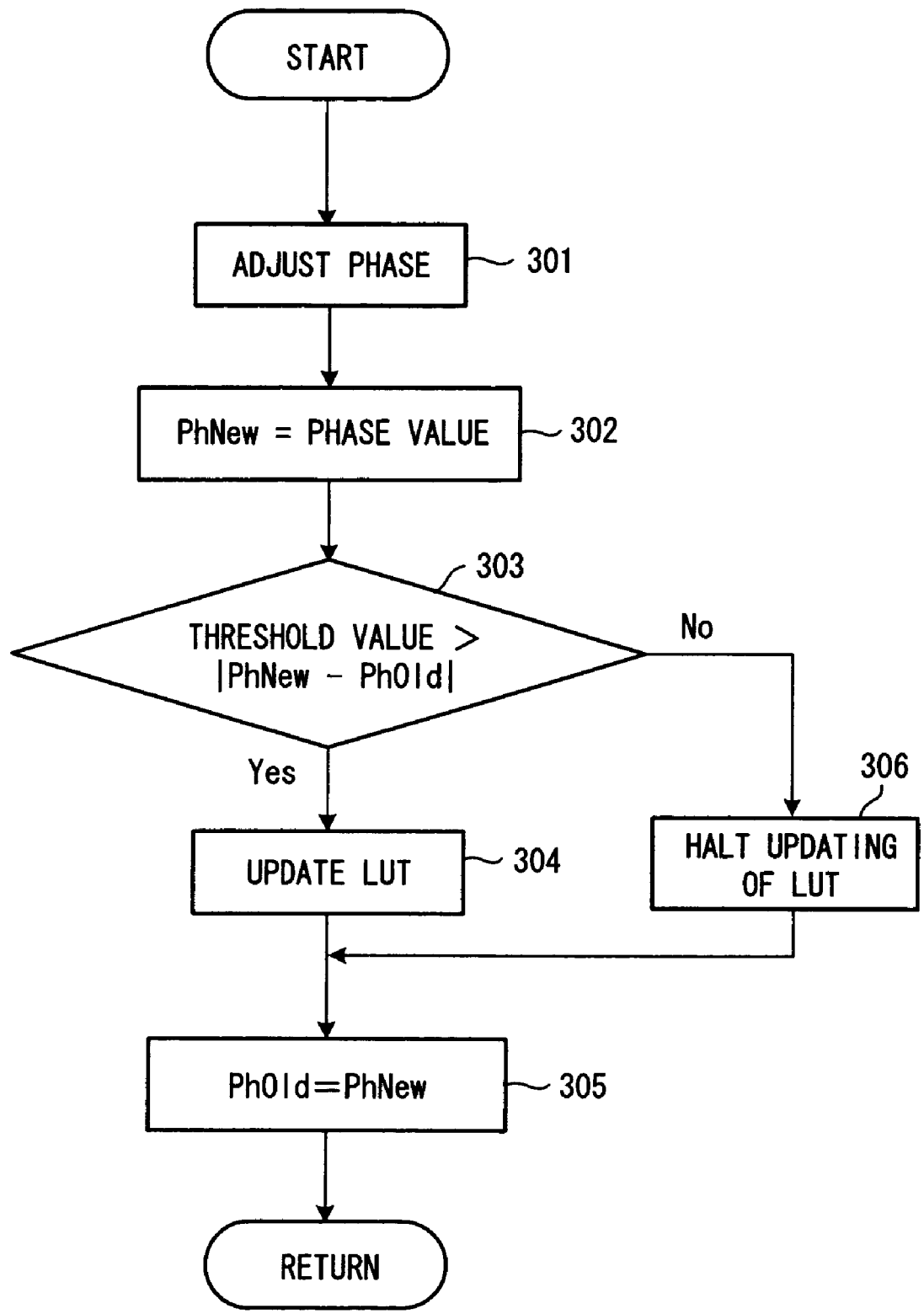
FIG. 9 is a flowchart of processing according to the modification.

FIG. 9 is a flowchart of processing according to this modification. The phase correcting interval Δt and distortion compensation coefficient updating interval ΔT are generated alternately under the control of the intermittent controller 69 (see FIG. 1). In the phase correcting interval Δt, the intermittent controller 69 calculates the reference signal and the phase difference Δφ, inputs the phase difference to the complex multiplier 65 and corrects the phase of the feedback signal in such a manner that the phase difference will become zero (step 301). The phase-difference monitoring unit 71 calculates the amount of fluctuation between the present phase difference PhNew and the previous phase difference PhOld, checks to see whether the amount of fluctuation is greater than a threshold value (steps 302, 303) and inputs the result of the comparison to the table update controller 72. If the amount of fluctuation is less than the threshold value, the table update controller 72 judges that the transmit signal is not a gap segment and, in the distortion compensation coefficient updating interval ΔT, places an enable signal ENS' at the high level to make possible the updating of the distortion compensation table (LUT) (step 304). The present phase difference PhNew is then made PhOld (step 305), control returns to the start and processing is repeated from this point onward.

If the amount of fluctuation is found to be greater than the threshold value at step 303, on the other hand, then the table update controller judges that the transmit signal is a gap segment and, in the distortion compensation coefficient updating interval ΔT, places the enable signal ENS' at the low level to halt the updating of the distortion compensation table (LUT) (step 306). The present phase difference PhNew is then made PhOld (step 305), control returns to the start and processing is repeated from this point onward.

(D) Third Embodiment

Figure 10:
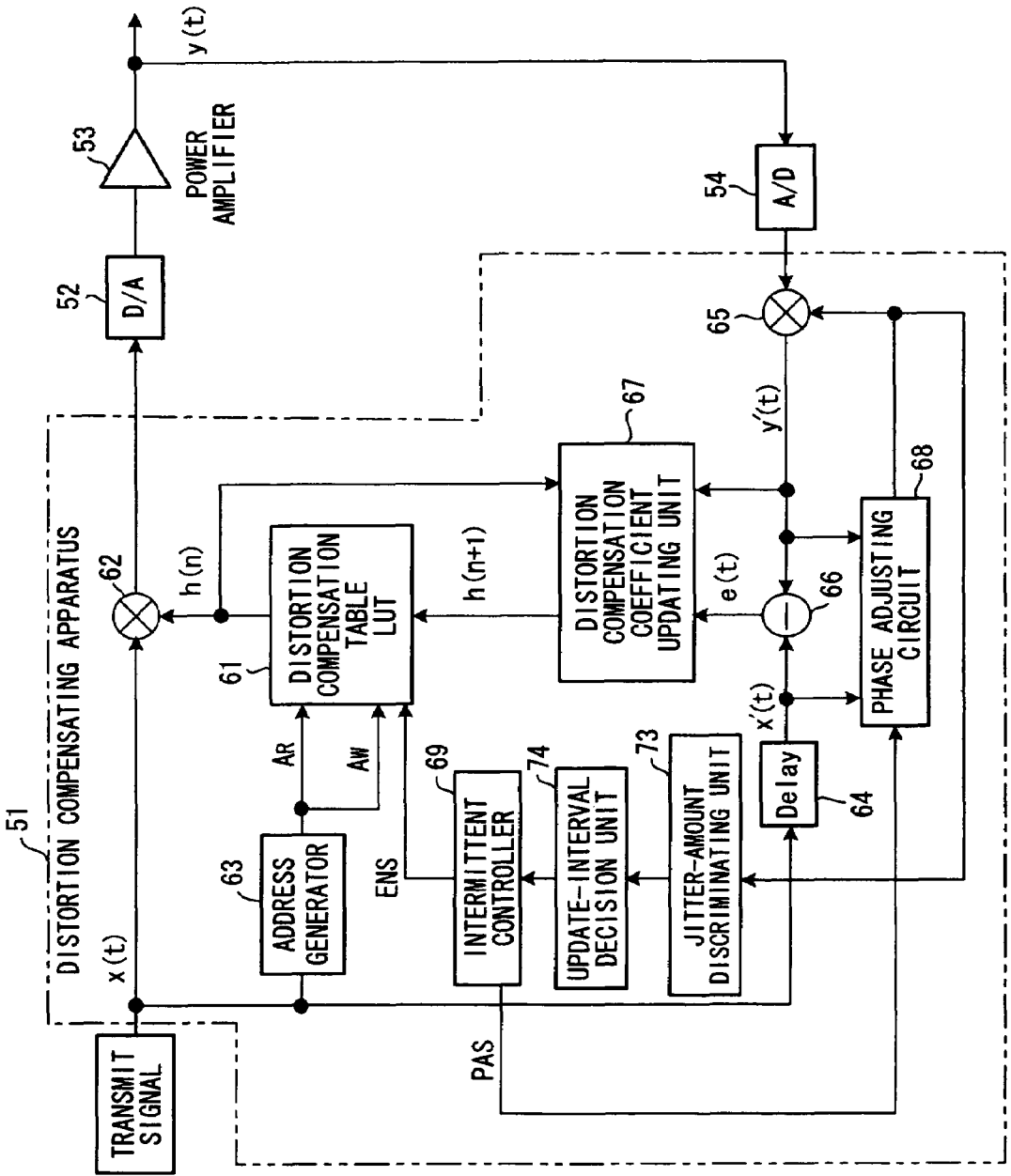
FIG. 10 is a block diagram of a distortion compensating apparatus according to a third embodiment.

FIG. 10 is a block diagram of a distortion compensating apparatus according to a third embodiment. Components identical with those of the first embodiment of FIG. 2 are designated by like reference characters. This embodiment differs in that ① a jitter-amount discriminating unit 73 is provided for discriminating amount of jitter; ② an update-interval decision unit 74 is provided for varying the length of the distortion compensation coefficient updating interval ΔT based upon the amount of jitter, and ③ the intermittent controller 69 raises the enable signal ENS to the high level in the distortion compensation coefficient updating interval ΔT decided and places the enable signal ENS at the low level in the phase correcting interval Δt.

The reason for controlling the distortion compensation coefficient updating interval ΔT is that if the amount of jitter is large, it is necessary to mitigate the influence of jitter by shortening the updating time of the distortion compensation table (LUT). In order to judge the amount of jitter, the third embodiment measures the total value of phase differences, the average value thereof or the amount of variance. The amount of jitter is measured quantitatively by utilizing the fact that the instantaneous fluctuation in phase difference is violent if the amount of jitter is large and miniscule if the instantaneous fluctuation in phase difference is small. As for a method of controlling updating time of the distortion compensation table (LUT), the LUT updating time is set to be short if the amount of jitter is large and, conversely, is set to be long if the amount of jitter is small.

Figure 11:
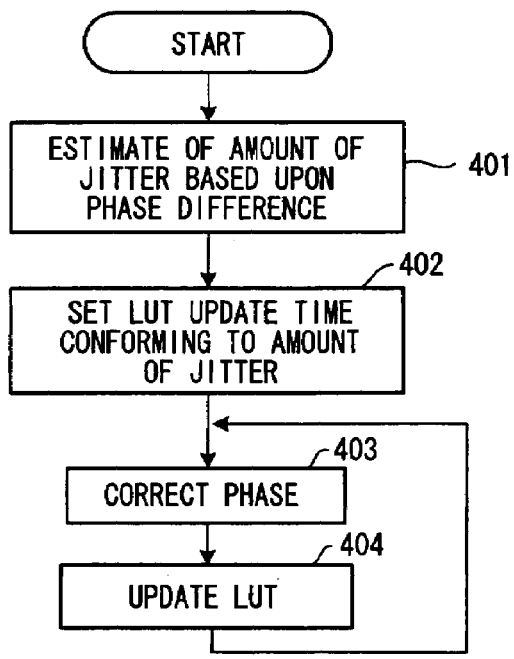
FIG. 11 is a flowchart of processing according to the third embodiment.
Figure 12:
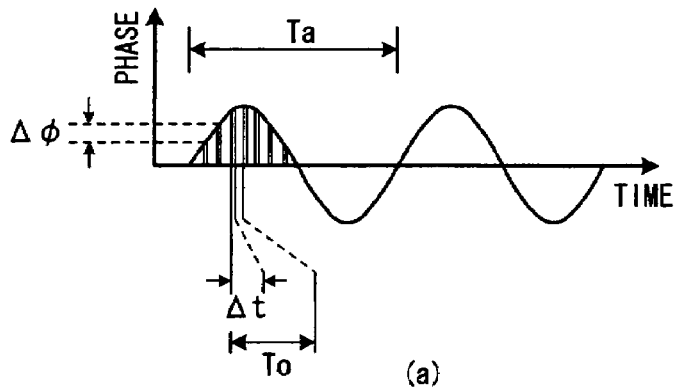
FIG. 12 is a diagram useful in describing calculation of a total value of phase differences or an average value of phase differences.
Figure 12:
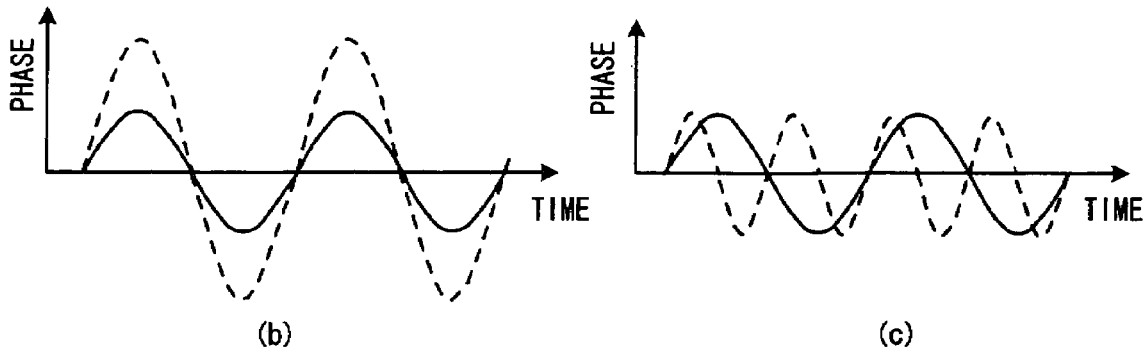

FIG. 11 is a flowchart of processing according to the third embodiment. The amount of jitter is estimated prior to intermittent control of phase correction and updating of the distortion compensation coefficient (step 401) and the distortion compensation coefficient updating interval ΔT is decided in accordance with the amount of jitter (step 402). In the estimating of amount of jitter at step 401, the phase adjusting circuit 68 calculates the phase difference between the reference signal and feedback signal in the interval Δt at fixed periods $T_0$ set in advance, as shown in FIG. 12, and inputs the phase difference to the jitter-amount discriminating unit 73. In the estimating of amount of jitter, however, phase correction is not carried out. Further, it may be so arranged that $T_0 = \Delta t$ holds.

By way of example, the jitter-amount discriminating unit 73 estimates the amount of jitter based upon the total value of instantaneous fluctuation in phase over a prescribed interval Ta shown at (a) of FIG. 12. That is, if the amount of jitter is large (=instantaneous fluctuation Δφ in phase is large), the amplitude of the phase-difference characteristic at (b) of FIG. 12 takes on a large value, as indicated by the dashed line, or the period of fluctuation of the phase-difference characteristic at (c) of FIG. 12 speeds up, as indicated by the dashed line. As a result, the total value of the instantaneous fluctuation Δφ in phase increases and the amount of jitter can be estimated.

The update-interval decision unit 74 stores the correspondence between the amount of jitter and distortion compensation coefficient updating interval ΔT in advance, decides the distortion compensation coefficient updating interval ΔT that conforms to the amount of jitter estimated and inputs this to the intermittent controller 69.

The intermittent controller 69 thenceforth executes phase correction processing (step 403) and processing (step 404) for updating the distortion compensation table (LUT) alternately in a manner similar to that of the first embodiment based upon the phase correction interval Δt and the distortion compensation coefficient updating interval ΔT that has been decided.

Thus, in accordance with the third embodiment, if the instantaneous fluctuation Δφ in phase is small, the updating interval can be lengthened and therefore the distortion compensation coefficient can be made to converge rapidly. Further, if the instantaneous fluctuation Δφ in phase is large, the distortion compensation coefficient updating interval can be shortened and therefore the distortion compensation coefficient can be updated only in an interval in which the phase difference has been diminished by a correction. This makes it possible to mitigate the effects of jitter.

Figure 13:
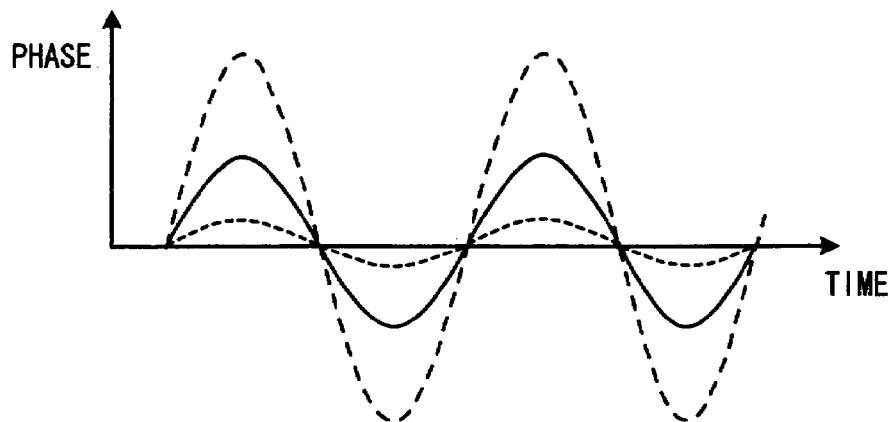
FIG. 13 is a diagram useful in describing calculation of phase-difference variance.

A method of determining the degree to which amplitude increases or decreases as indicated by the dashed line in FIG. 13 is also available. Specifically, this is a method of deciding amount of jitter based upon amount of variance in phase difference. The amount of variance can be calculated by the following equation:

$$\text{variance} = \Sigma(Xi - Xm)^2/N (i = 1 \text{ to } N)$$

where Xi represents an ith phase difference, Xm the average value of phase difference and N the number of samples.

Figure 14:
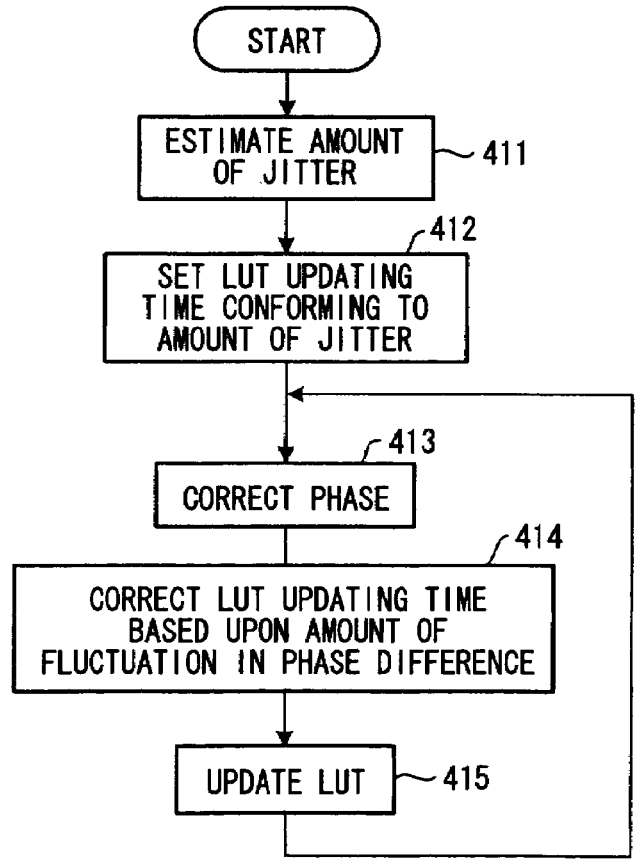
FIG. 14 is a flowchart of processing for monitoring a fluctuation in phase difference and varying a distortion compensation coefficient updating interval.

In the processing flowchart of FIG. 11, a case where the distortion compensation coefficient updating interval ΔT is fixed after it has been decided is described. However, the fluctuation in phase difference can be monitored and ΔT can be controlled so as to vary. FIG. 14 is a processing flowchart for such a case. In a manner similar to that of the processing flowchart of FIG. 11, the amount of jitter is estimated (step 411) before intermittent control of phase correction and of updating of the distortion compensation coefficient, and the distortion compensation coefficient updating interval ΔT is decided (step 412) in accordance with this amount of jitter.

Next, the phase adjusting circuit 68 detects the phase difference in the phase correcting interval Δt and the complex multiplier 65 corrects the phase difference of the feedback signal based upon this phase difference (step 413). The jitter-amount discriminating unit 73 calculates the amount of fluctuation from the previous phase difference (initially, amount of fluctuation=0 holds), and the update-interval decision unit 74 corrects the distortion compensation coefficient updating interval ΔT based upon this amount of fluctuation (step 414). The intermittent controller 69 places the enable signal at the high level for the duration of the distortion compensation coefficient updating interval ΔT, thereby enabling processing for updating the distortion compensation table (LUT) (step 415). Processing from step 413 onward is then repeated.

If the above arrangement is adopted, any fluctuation in amount of jitter can be followed up and the distortion compensation coefficient updating interval can be controlled. As a result, the effects of jitter can be mitigated.

Modification

In the third embodiment, the distortion compensation coefficient updating interval ΔT is decided based upon the amount of jitter. However, the distortion compensation coefficient updating interval ΔT can be held fixed and an updating time constant of the distortion compensation coefficient updating unit can be changed instead. If the updating time constant is shortened, the distortion compensation coefficient updating interval is equivalently lengthened; if the updating time constant is lengthened, then the distortion compensation coefficient updating interval is equivalently shortened.

Figure 30:
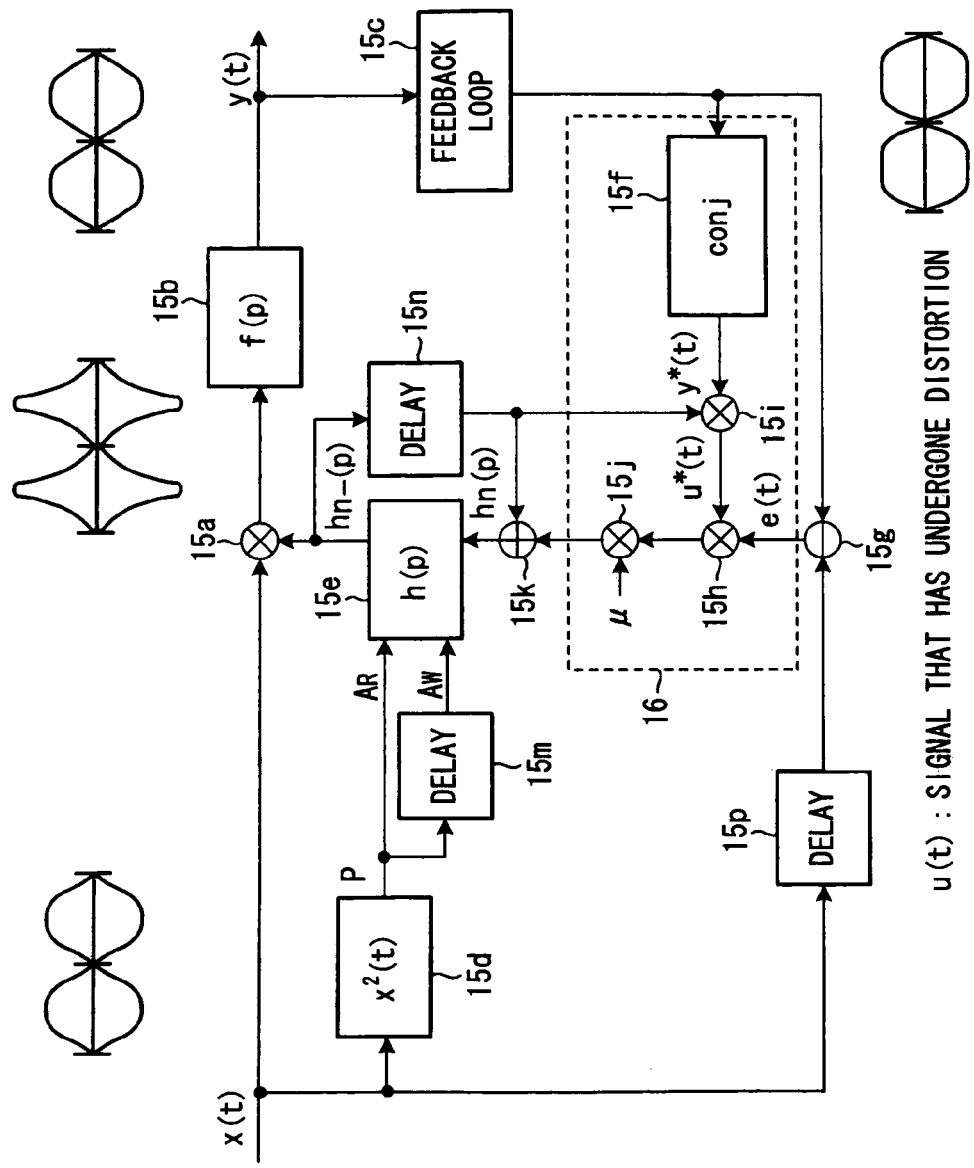
FIG. 30 is a diagram useful in describing distortion compensation processing according to an adaptive LMS algorithm.

The updating time constant of the distortion compensation coefficient updating unit 67 can be controlled by changing the value of the step-size parameter μ (see FIG. 30). For example, if the value of the step-size parameter μ is enlarged, convergence speed rises and the updating time constant is shortened. Further, if the value of the step-size parameter μ is reduced, then convergence speed falls and the updating time constant is lengthened.

Figure 15:
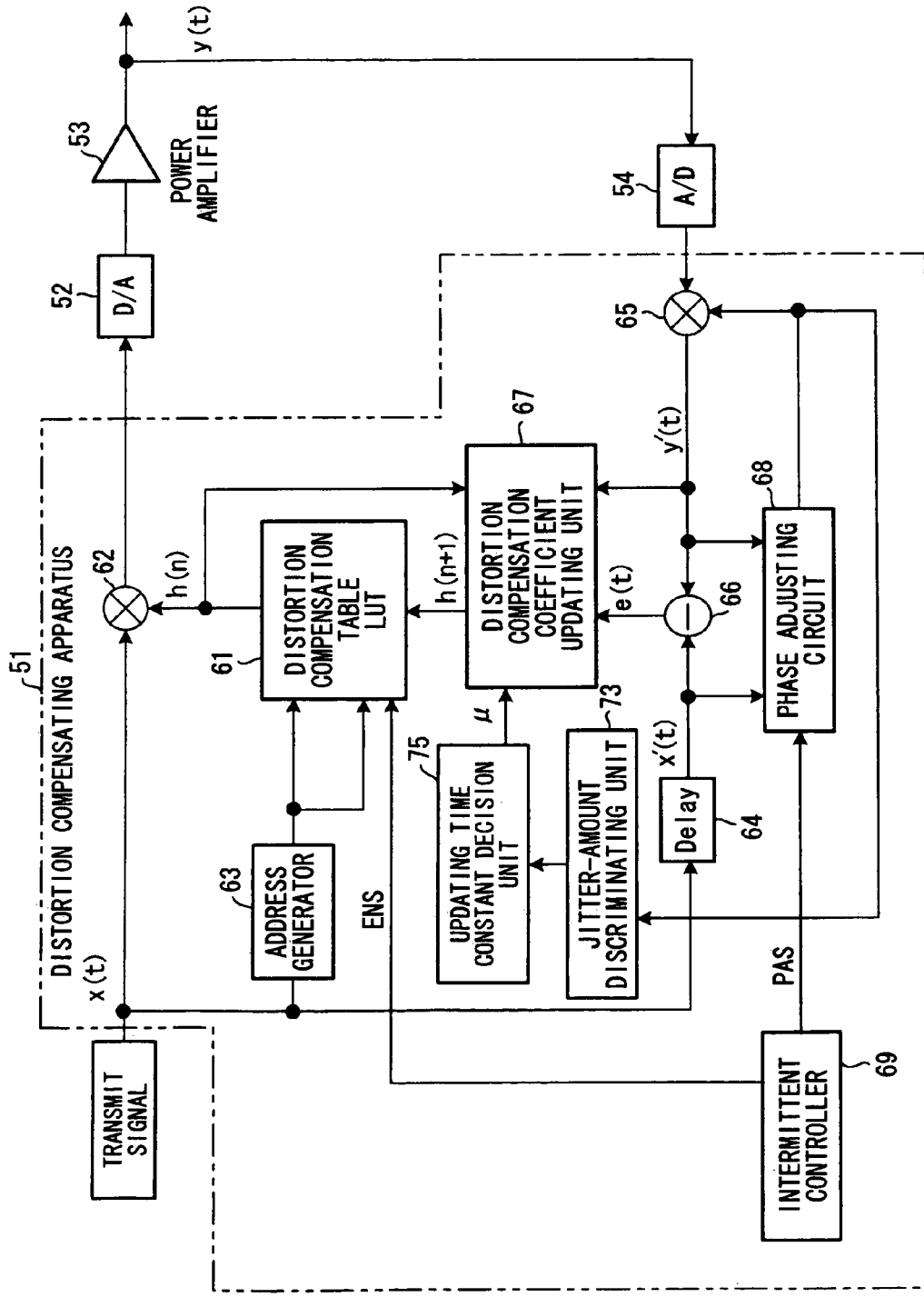
FIG. 15 shows an example of a modification of the third embodiment.

FIG. 15 is a modification of the third embodiment. Here it is so arranged that the updating time constant, namely the value of the step size of the step-size parameter μ, is changed based upon the amount of jitter. The modification differs from the third embodiment in the following points:

① the phase correcting interval Δt and the distortion compensation coefficient updating interval ΔT are held fixed; and ② an updating time constant decision unit 75 for controlling the updating time constant based upon amount of jitter is provided instead of the update-interval decision unit 74.

Figure 16:
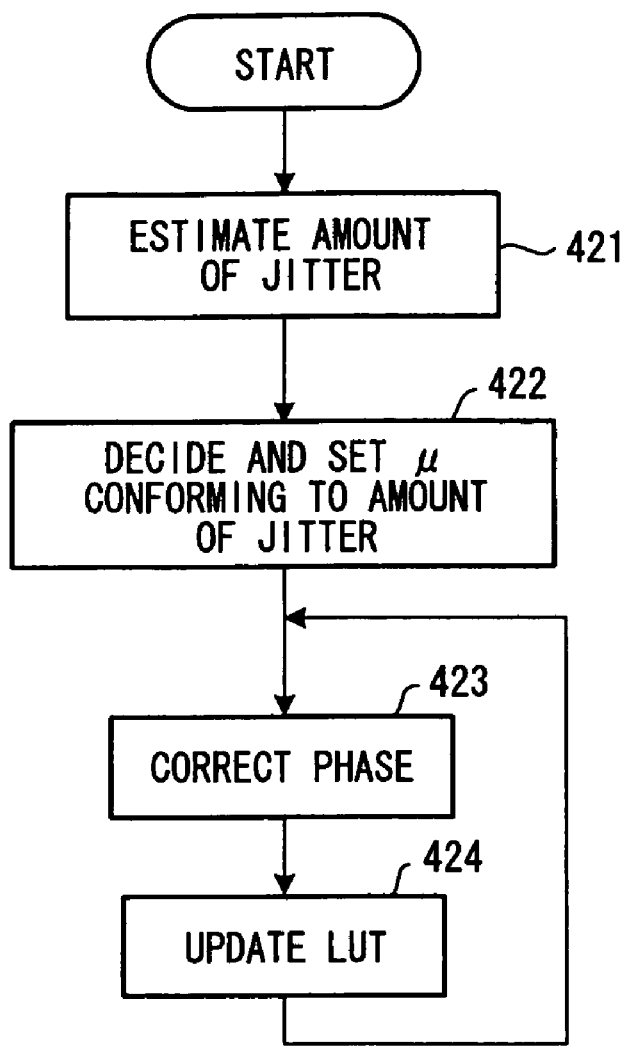
FIG. 16 is a flowchart of processing according to this modification.

FIG. 16 is processing flowchart of this modification. In a manner similar to that of the third embodiment, the jitter-amount discriminating unit 73 estimates the amount of jitter (step 421) before intermittent control of phase correction and of updating of the distortion compensation coefficient, and the updating time constant decision unit 75 has a table indicating the correspondence between amount of jitter and values of the step-size parameter μ of adaptive signal processing. The updating time constant decision unit obtains the value of the step-size parameter μ, which conforms to estimated amount of jitter, from the table and sets it in the distortion compensation coefficient updating unit 67 (step 422). As a result, in the distortion compensation coefficient updating interval ΔT, the distortion compensation coefficient updating unit 67 executes adaptive signal processing using the set value of μ and calculates the distortion compensation coefficient h(n+1).

Processing for phase correction (step 423) and for updating the distortion compensation table (LUT) (step 424) is thenceforth executed alternately based upon the phase correcting interval Δt and distortion compensation coefficient updating interval ΔT in a manner similar to that of the first embodiment.

Thus, in accordance with this modification, an effect equivalent to that obtained when the distortion compensation coefficient updating interval is controlled can be obtained by controlling the updating time constant based upon the amount of jitter.

(E) Fourth Embodiment

In the third embodiment, the distortion compensation coefficient updating interval is controlled based upon phase difference. However, the distortion compensation coefficient updating interval ΔT can also be controlled based upon an error signal e(t). This is because the error signal e(t) fluctuates in accordance with jitter.

Figure 17:
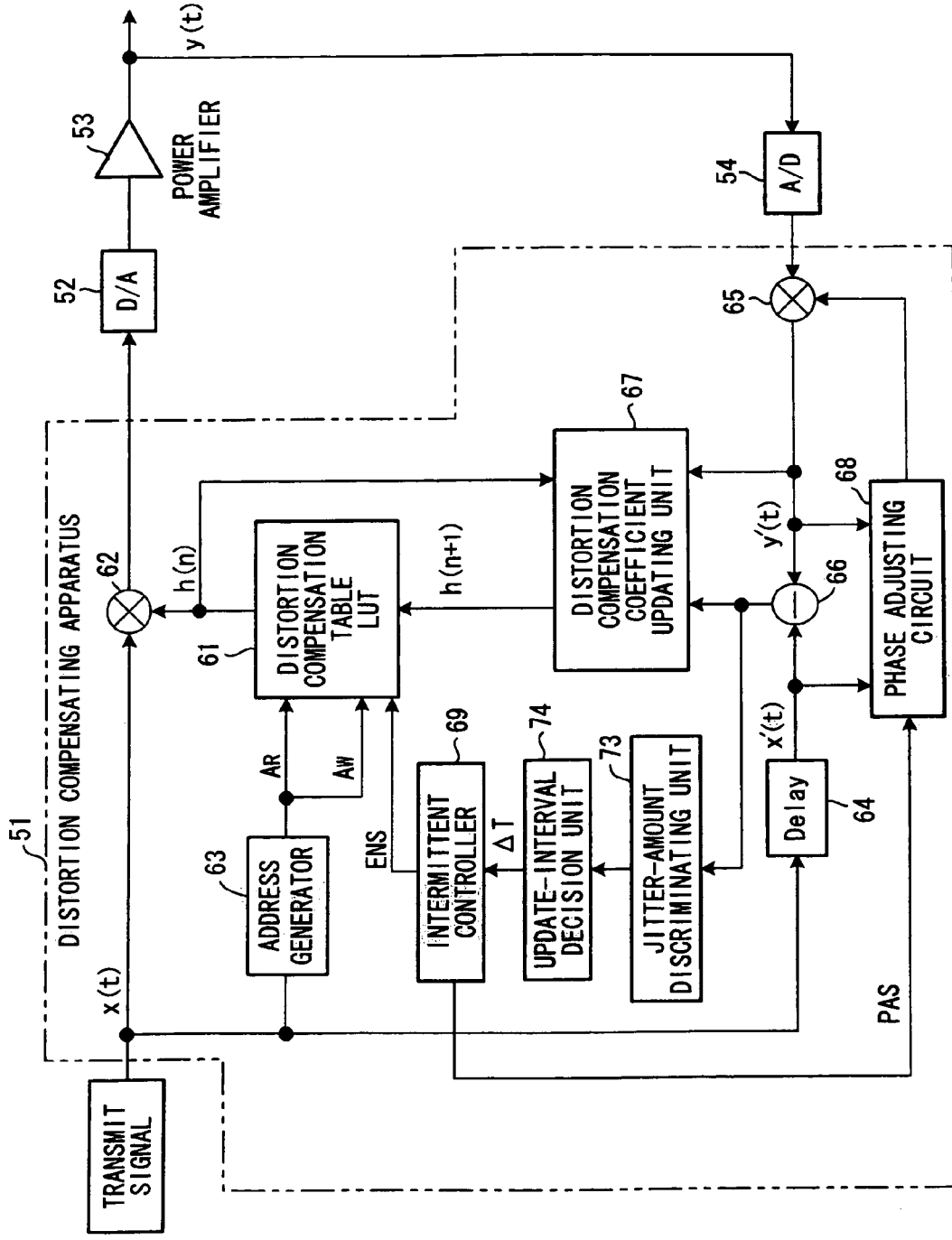
FIG. 17 is a block diagram of a distortion compensating apparatus according to a fourth embodiment.

FIG. 17 is a block diagram of a distortion compensating apparatus according to a fourth embodiment. Components identical with those of the third embodiment of FIG. 10 are designated by like reference characters. This embodiment differs from the third embodiment of FIG. 10 in that the jitter-amount discriminating unit 73 estimates the amount of jitter based upon the total value, average value or variance of the error signal e(t) that is output from the subtractor 66.

Figure 18:
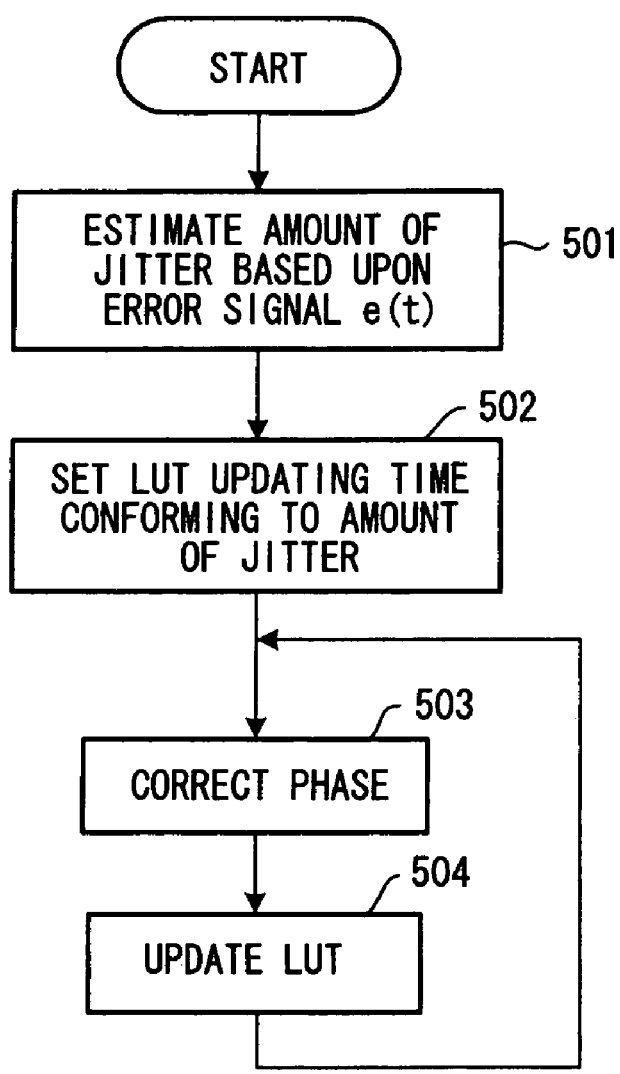
FIG. 18 is a flowchart of processing according to the fourth embodiment.

FIG. 18 is a flowchart of processing according to the fourth embodiment. When distortion compensation is being performed using the latest distortion compensation coefficient, the jitter-amount discriminating unit 73 estimates the amount of jitter (step 501) based upon average value or variance of the error signal e(t), and the update-interval decision unit 74 decides the distortion compensation coefficient updating interval ΔT based upon the amount of jitter (step 502). The intermittent controller 69 thenceforth alternately generates the phase correcting interval Δt and the distortion compensation coefficient updating interval ΔT that has been decided and repeats processing for phase correction and for updating of the distortion compensation table (LUT) (steps 503, 504). In accordance with the fourth embodiment, the influence of jitter can be mitigated.

Modification

Figure 19:
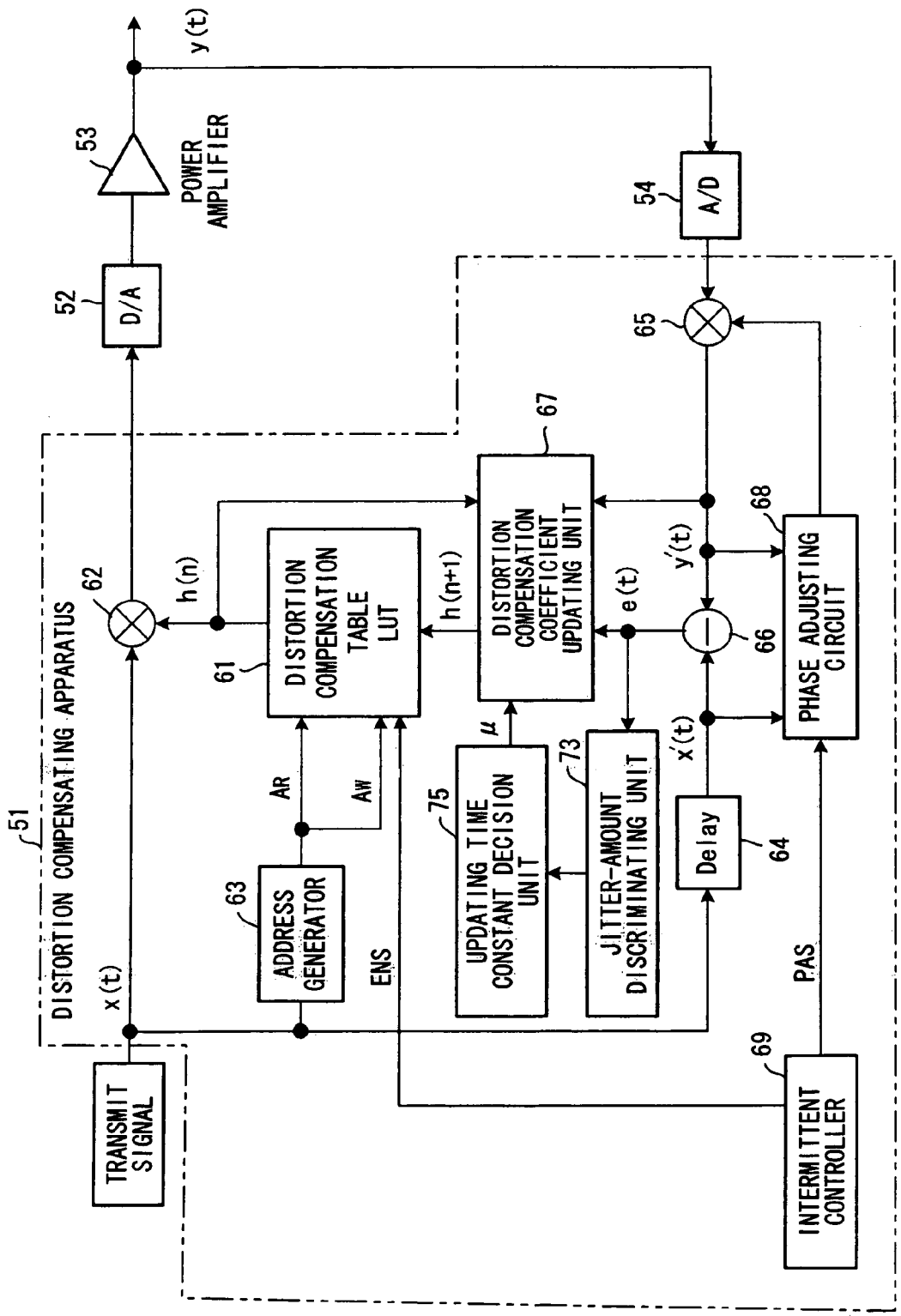
FIG. 19 shows an example of a modification of the fourth embodiment.

With the fourth embodiment, the distortion compensation coefficient updating interval ΔT is decided based upon the amount of jitter. However, the distortion compensation coefficient updating interval ΔT can be held fixed and an updating time constant of the distortion compensation coefficient updating unit can be changed instead. FIG. 19 illustrates a modification of the fourth embodiment. Here it is so arranged that the updating time constant, namely the value of the step size of the step-size parameter μ, is changed based upon the amount of jitter. The modification differs from the fourth embodiment of FIG. 17 in the following points:

① the phase correcting interval Δt and the distortion compensation coefficient updating interval ΔT are held fixed; and ② the updating time constant decision unit 75 for controlling the updating time constant (the step-size parameter μ) based upon amount of jitter is provided instead of the update-interval decision unit 74.

The flow of processing, which differs only in that the updating time constant (the step-size parameter μ) is controlled based upon the amount of jitter, can be executed in a manner similar to that of the processing flow of FIG. 18. In accordance with this modification, effects equivalent to those obtained when the distortion compensation coefficient updating interval is controlled based upon amount of jitter can be obtained.

(F) Fifth Embodiment

In the third embodiment, the distortion compensation coefficient updating interval is controlled based upon phase difference. However, the distortion compensation coefficient updating interval can also be controlled based upon the ACPR (Adjacent Channel Power Ratio) of the feedback signal. In a system in which jitter is violent, unwanted waves will be produced in the amplifier output unless jitter countermeasures are taken. These unwanted waves can be verified also in the feedback signal. Accordingly, in the fifth embodiment, ACPR is measured, the amount of jitter is discriminated quantitatively based upon the ACPR, the distortion compensation coefficient updating interval $\Delta T$ is set short if the amount of jitter is large and, conversely, is set long if the amount of jitter is small.

Figure 20:
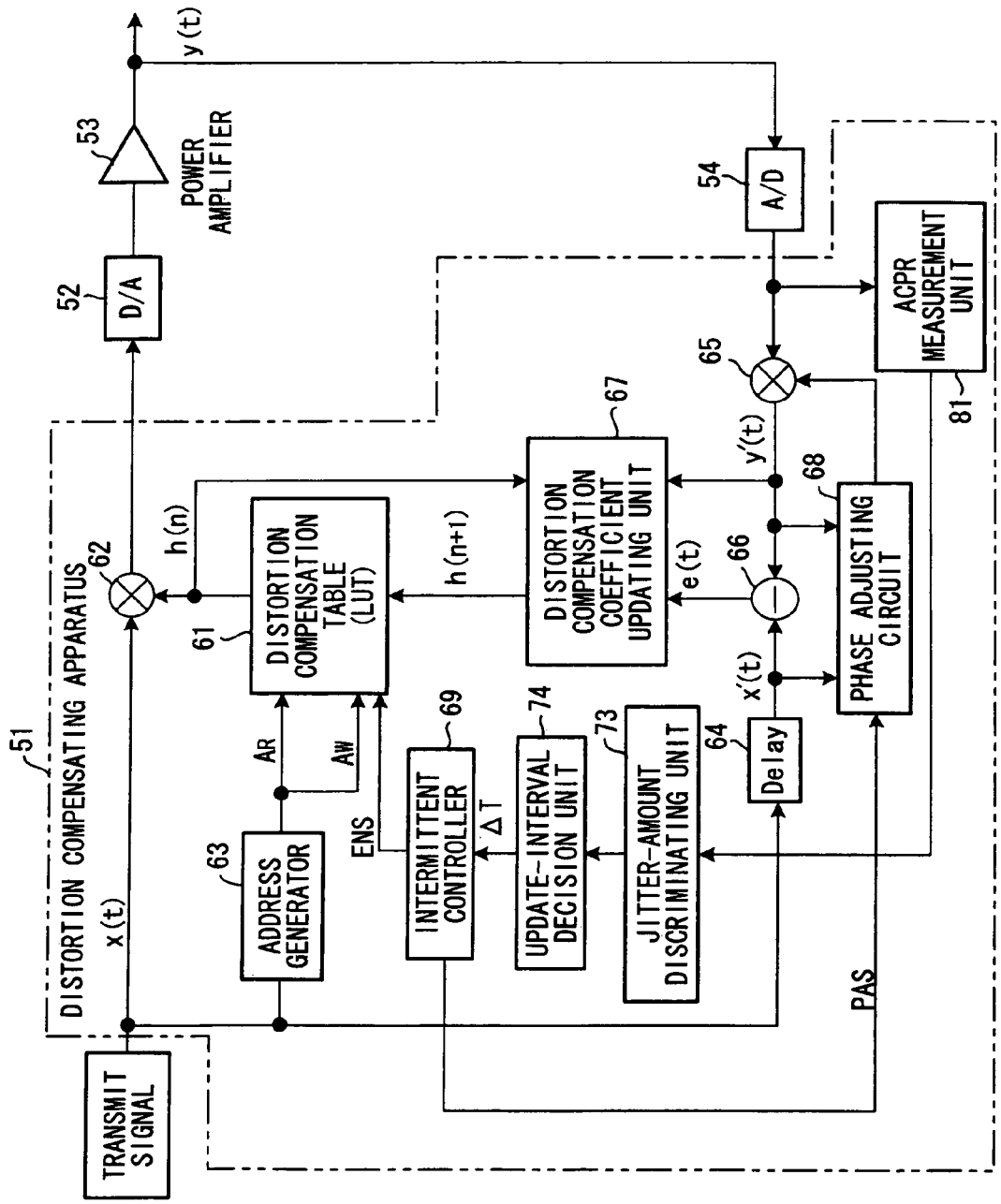
FIG. 20 is a block diagram of a distortion compensating apparatus according to a fifth embodiment.

FIG. 20 is a block diagram of a distortion compensating apparatus according to a fifth embodiment. Components identical with those of the third embodiment of FIG. 10 are designated by like reference characters. This embodiment differs from the third embodiment of FIG. 10 in that ① an ACPR measurement unit 81 is provided, and ② the jitter-amount discriminating unit 73 estimates the amount of jitter based upon the total value, average value or variance of the measurement ACPR in a prescribed interval.

Figure 21:
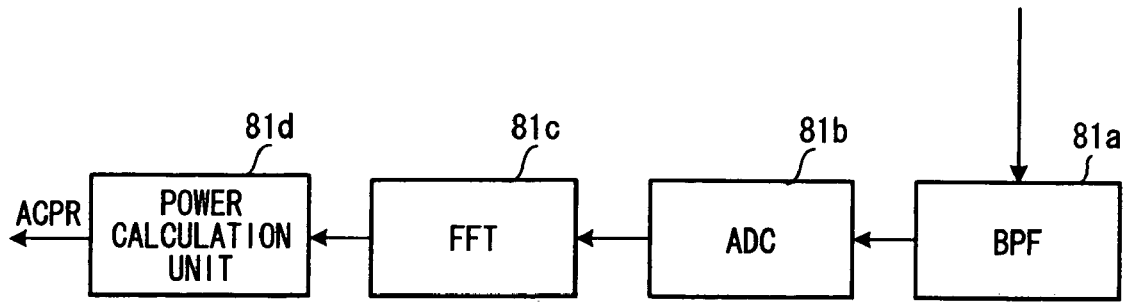
FIG. 21 is a block diagram of an ACPR measuring apparatus.

FIG. 21 is a block diagram of the ACPR measurement unit 81. An adjacent-channel signal component that enters from a band-pass filter 81a is subjected to an A/D conversion by an AD converter 81b, the output obtained by the A/D conversion is subjected to an FFT operation by an FFT arithmetic unit 81c, and a power calculation unit 81d calculates adjacent-channel power using the FFT output, calculates the ACPR using the adjacent-channel power and the power of a channel of interest and outputs the result.

Figure 22:
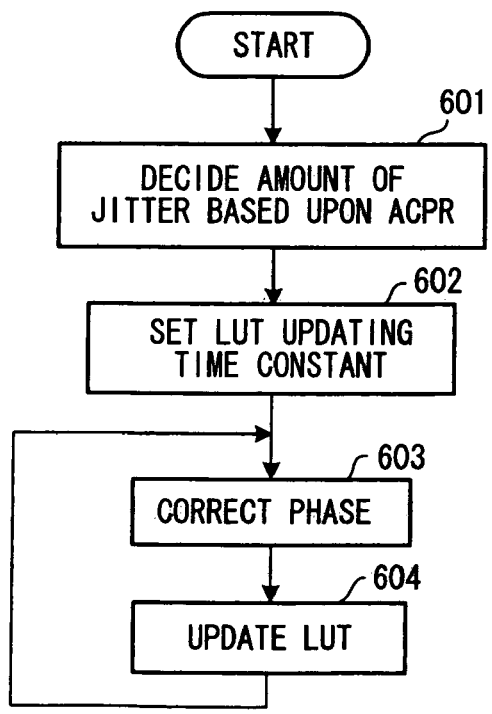
FIG. 22 is a flowchart of processing according to the fifth embodiment.

FIG. 22 is a processing flowchart according to the fifth embodiment. When distortion compensation is performed using the latest distortion compensation coefficient, the ACPR measurement unit 81 measures the ACPR and outputs the result. The jitter-amount discriminating unit 73 estimates the amount of jitter based upon the average value or variance of the ACPR (step 601), and the update-interval decision unit 74 decides the distortion compensation coefficient updating interval $\Delta T$ based upon the amount of jitter (step 602). The intermittent controller 69 thenceforth generates the phase correcting interval $\Delta t$ and the decided distortion compensation coefficient updating interval $\Delta T$ alternately and repeatedly executes a phase correction and processing for updating the distortion compensation table (LUT) (steps 603, 604). Thus, in accordance with the fourth embodiment, the influence of jitter can be mitigated.

Modification

Figure 23:
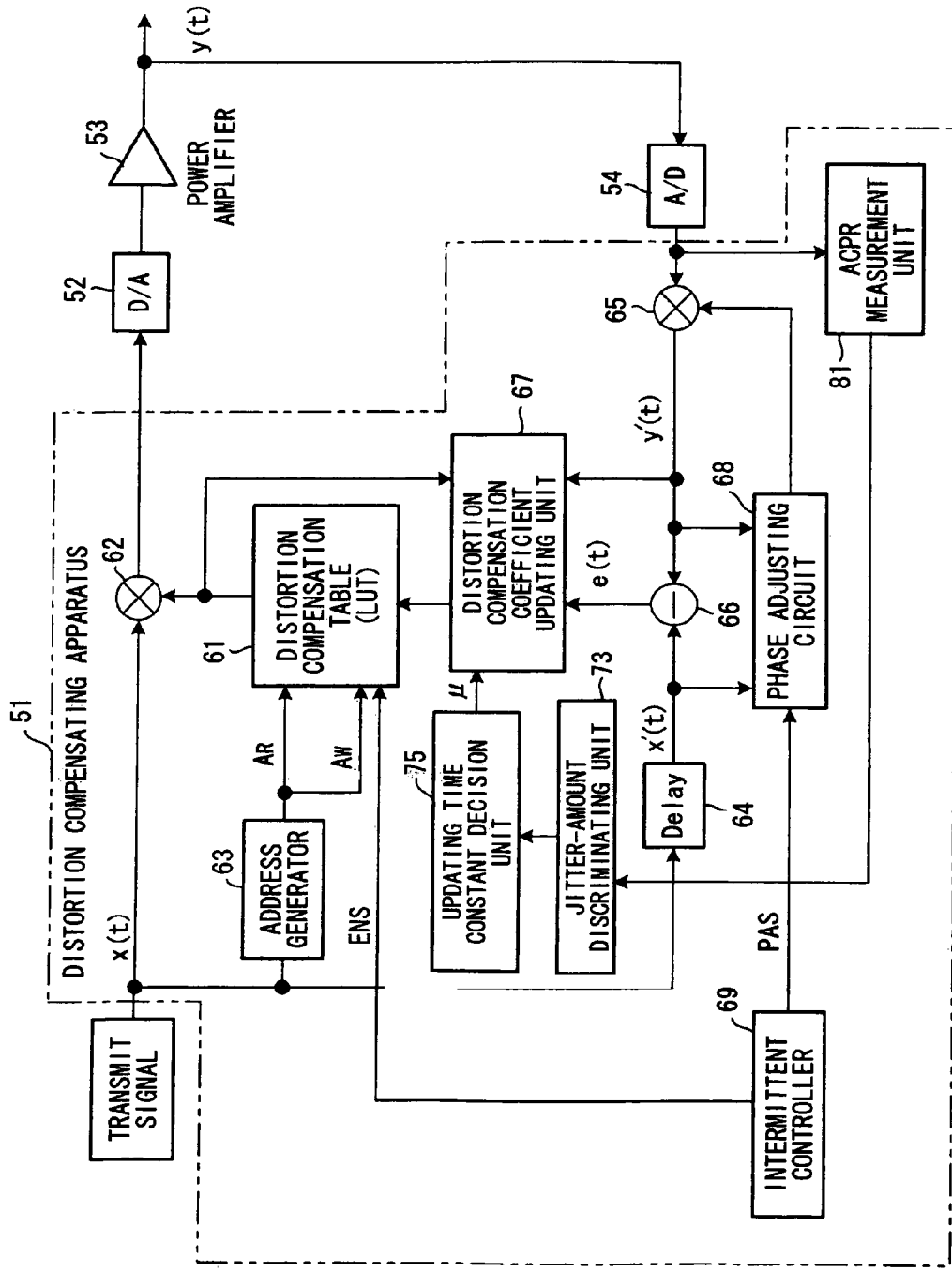
FIG. 23 shows an example of a modification of the fifth embodiment.

In the fifth embodiment, the distortion compensation coefficient updating interval $\Delta T$ is decided based upon the amount of jitter. However, the distortion compensation coefficient updating interval $\Delta T$ can be held fixed and the updating time constant of the distortion compensation coefficient updating unit can be changed instead. FIG. 23 illustrates a modification of the fifth embodiment. Here it is so arranged that the updating time constant, namely the value of the step size of the step-size parameter $\mu$, is changed based upon the amount of jitter. This modification differs from the fifth embodiment of FIG. 20 in the following points:

① the phase correcting interval $\Delta t$ and the distortion compensation coefficient updating interval $\Delta T$ are held fixed; and ② the updating time constant decision unit 75 for controlling the updating time constant (step-size parameter $\mu$) based upon amount of jitter is provided instead of the update-interval decision unit 74.

The fact that the updating time constant (the step-size parameter $\mu$) is controlled based upon the amount of jitter is the only difference in comparison with the processing flowchart of FIG. 22; other processing is executed in the same manner as that of FIG. 22. In accordance with this modification, it is possible to obtain an effect equivalent to that obtained when the distortion compensation coefficient updating interval is controlled based upon the amount of jitter.

(G) Sixth Embodiment

In the third embodiment, the distortion compensation coefficient updating interval is controlled based upon phase difference. However, the distortion compensation coefficient updating interval can also be controlled based upon the speed at which the distortion compensation coefficient converges. In case of a system having a large amount of jitter, the distortion compensation coefficient does not converge to a fixed value and unstable oscillation is produced. Accordingly, the speed at which distortion compensation coefficient converges is judged, the amount of jitter is discriminated quantitatively, the distortion compensation coefficient updating interval $\Delta T$ is set short if the amount of jitter is large and, conversely, is set long if the amount of jitter is small.

Figure 24:
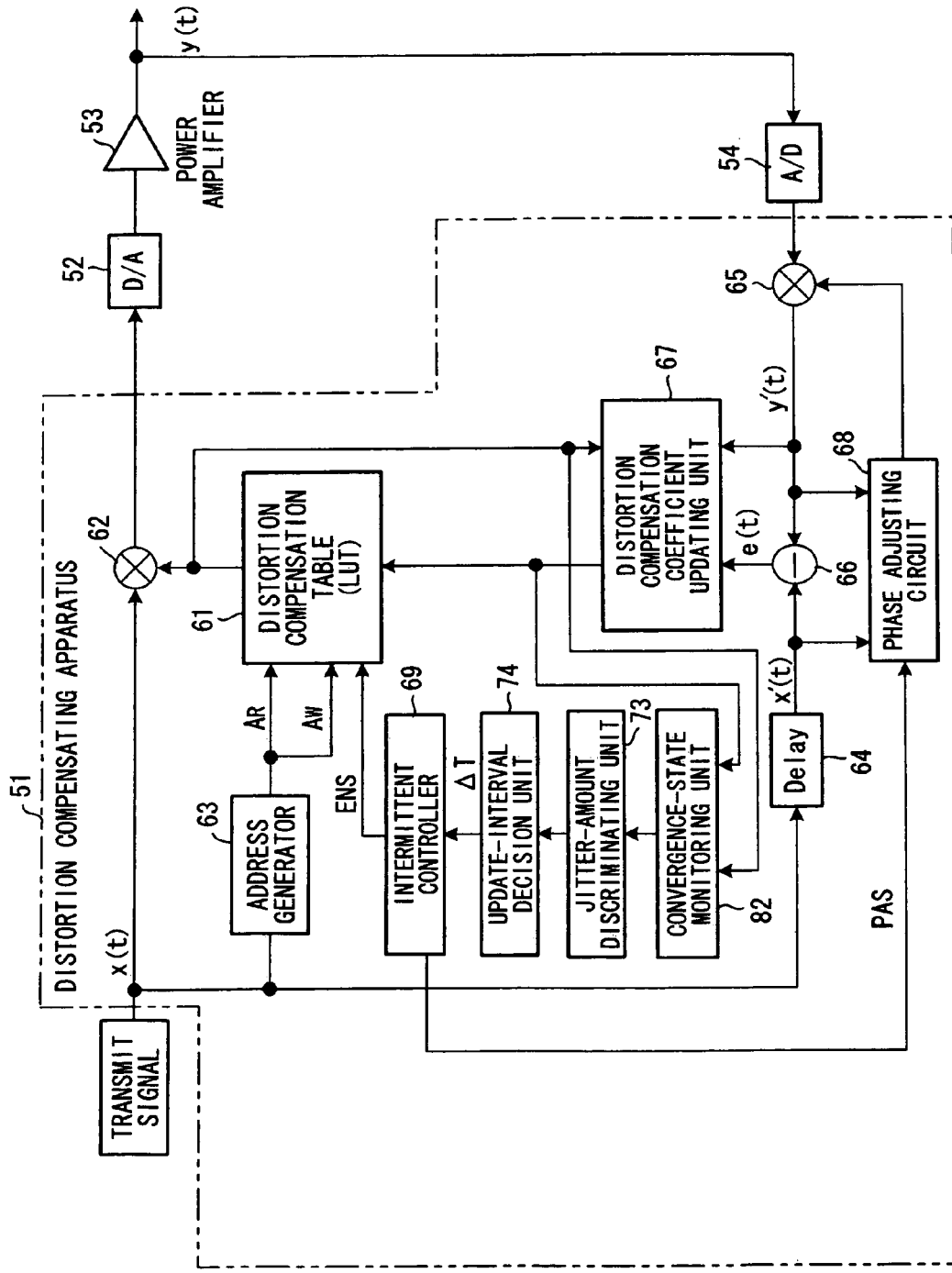
FIG. 24 is a block diagram of a distortion compensating apparatus according to a sixth embodiment.

FIG. 24 is a block diagram of a distortion compensating apparatus according to a sixth embodiment. Components identical with those of the third embodiment of FIG. 10 are designated by like reference characters. The sixth embodiment differs from the third embodiment of FIG. 10 in that ① a convergence-state monitoring unit 82 is provided, and ② the jitter-amount discriminating unit 73 estimates the amount of jitter based upon the degree of convergence stability.

Figure 25:
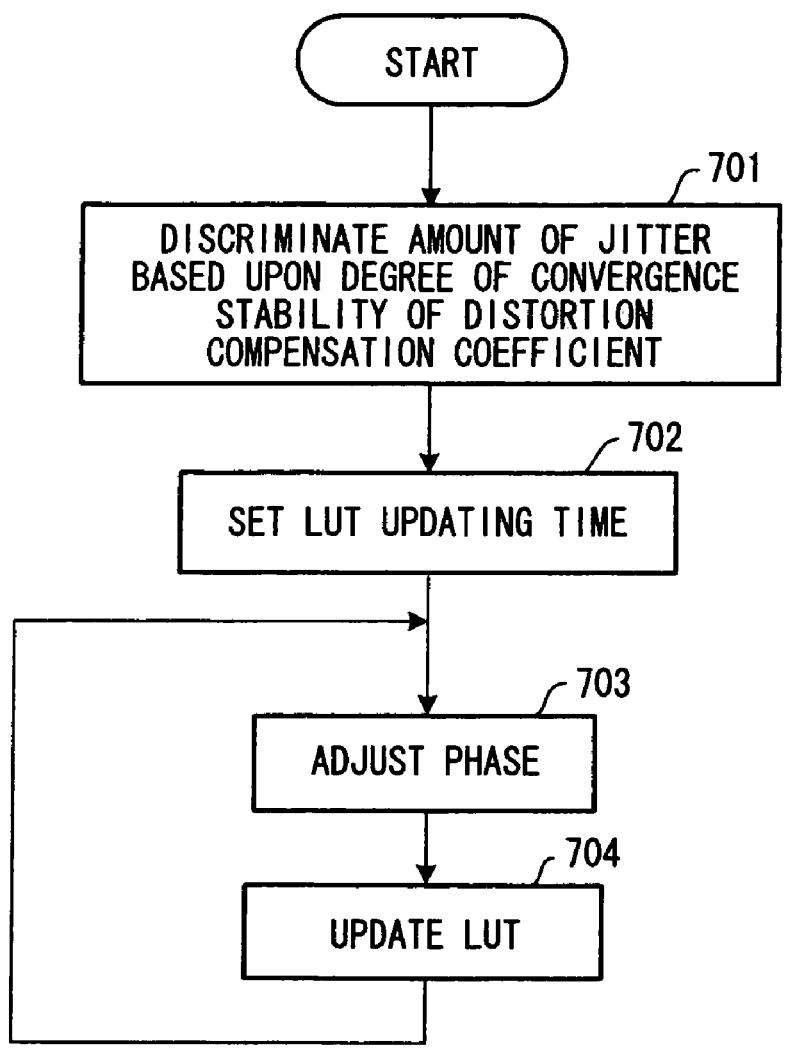
FIG. 25 is a flowchart of processing according to the sixth embodiment.

FIG. 25 is a flowchart of processing according to the fifth embodiment. The distortion compensation coefficient h(n) read out of the distortion compensation table 61 and used in distortion compensation processing and the new distortion compensation coefficient h(n+1) calculated by the distortion compensation coefficient updating unit 67 are input to the convergence-state monitoring unit 82, which proceeds to monitor the state of convergence (degree of convergence stability) based upon a summation value or average value of the difference between these coefficients in a prescribed interval. The jitter-amount discriminating unit 73 estimates the amount of jitter based upon the degree of convergence stability (step 701), and the update-interval decision unit 74 decides the distortion compensation coefficient updating interval $\Delta T$ based upon the amount of jitter (step 702). The intermittent controller 69 thenceforth generates the phase correcting interval $\Delta t$ and the decided distortion compensation coefficient updating interval $\Delta T$ alternately and repeatedly executes a phase correction and processing for updating the distortion compensation table (LUT) (steps 703, 704). Thus, in accordance with the sixth embodiment, the influence of jitter can be mitigated.

Modification

Figure 26:
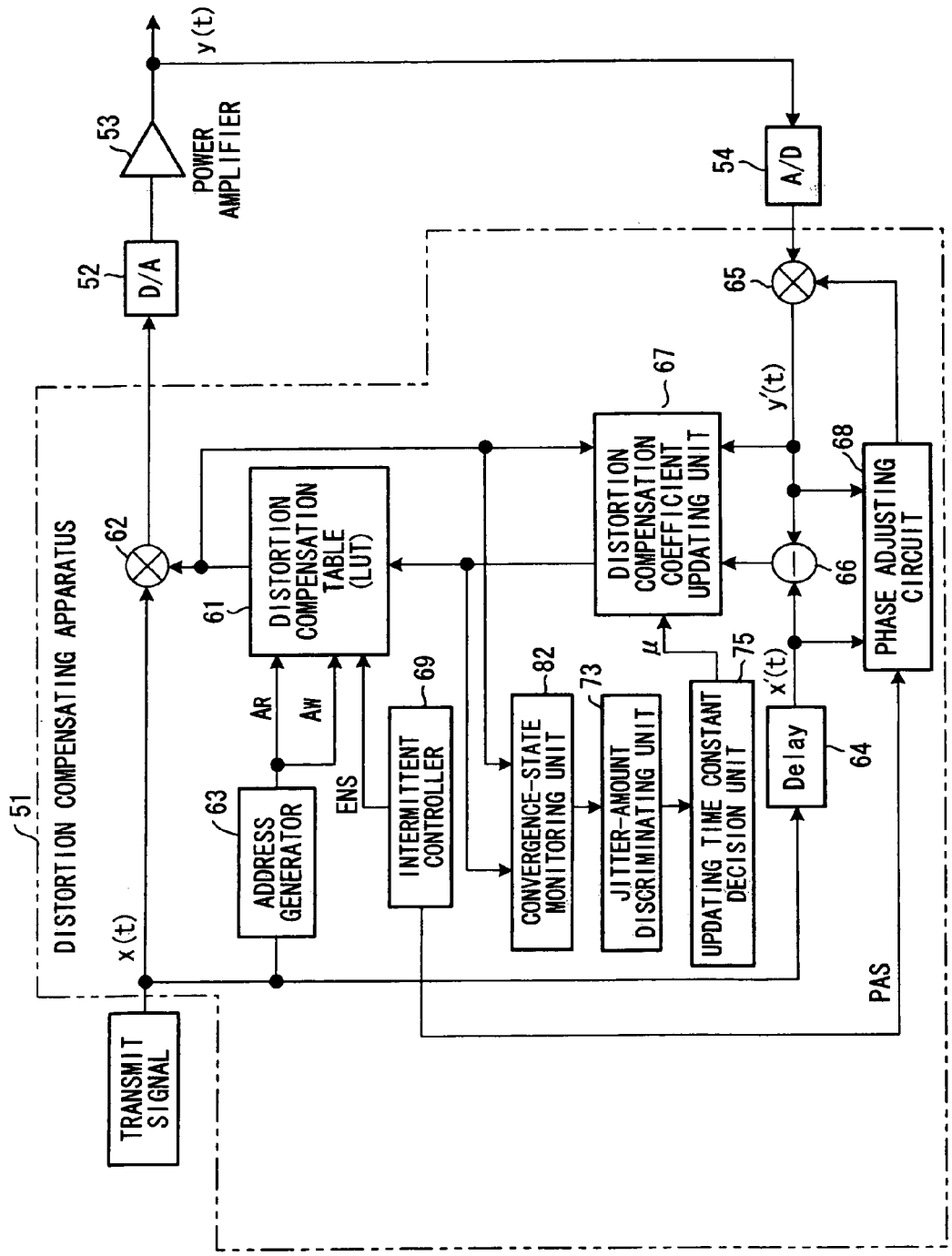
FIG. 26 shows an example of a modification of the sixth embodiment.
Figure 27:
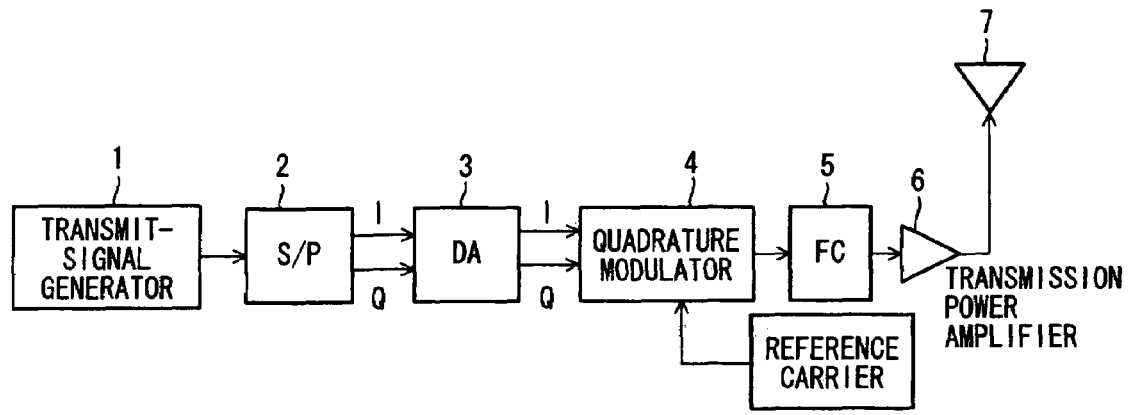
FIG. 27 is a block diagram illustrating an example of a transmitting apparatus in a radio according to the prior art.
Figure 28:
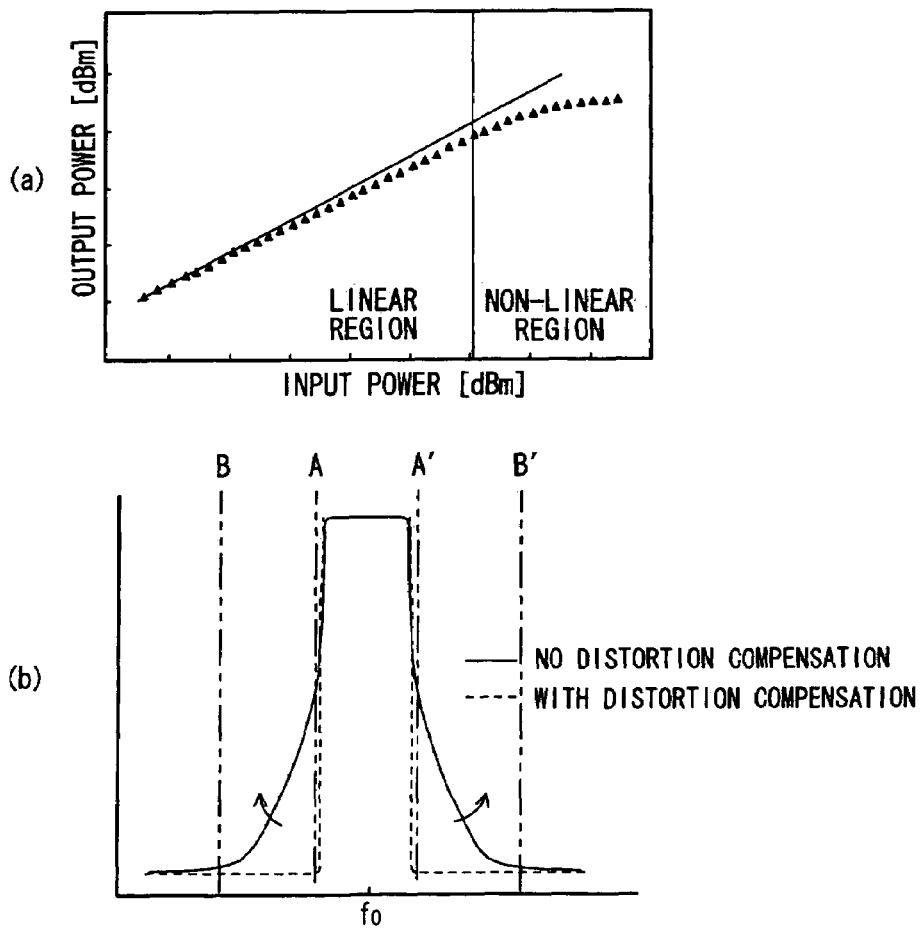
FIG. 28 illustrates an input/output characteristic and frequency spectrum in the vicinity of transmission frequency $f_O$ of a transmission power amplifier.
Figure 29:
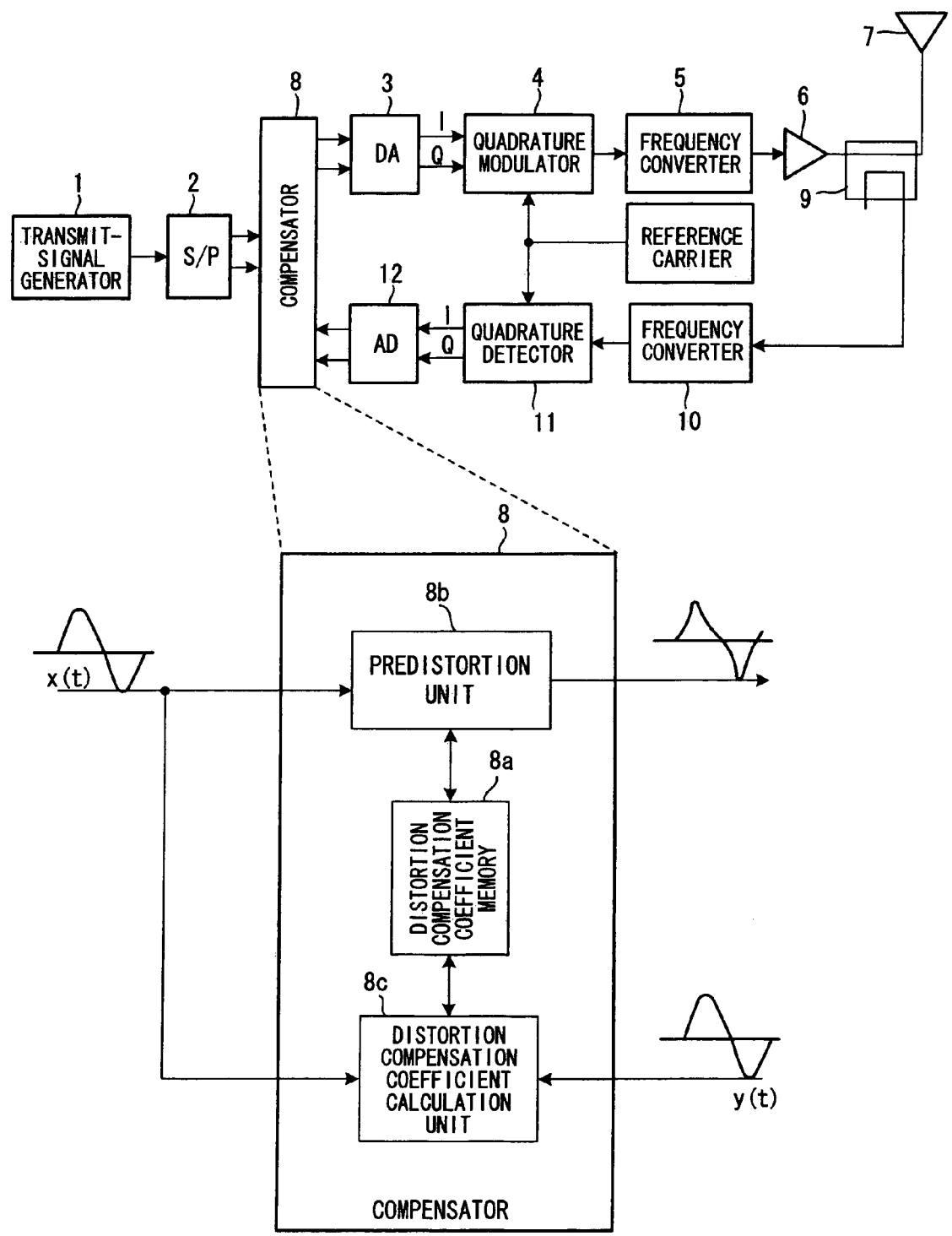
FIG. 29 is a block diagram of a transmitter equipped with a digital non-linear distortion compensating function.

In the sixth embodiment, the distortion compensation coefficient updating interval $\Delta T$ is decided based upon the amount of jitter. However, the distortion compensation coefficient updating interval $\Delta T$ can be held fixed and the updating time constant of the distortion compensation coefficient updating unit 67 can be changed instead. FIG. 26 illustrates a modification of the sixth embodiment. Here it is so arranged that the updating time constant, namely the value of the step size of the step-size parameter μ, is changed based upon the amount of jitter. This modification differs from the sixth embodiment of FIG. 24 in the following points:

① the phase correcting interval Δt and the distortion compensation coefficient updating interval ΔT are held fixed; and ② the updating time constant decision unit 75 for controlling the updating time constant (step-size parameter μ) based upon amount of jitter is provided instead of the update-interval decision unit 74.

The fact that the updating time constant (the step-size parameter μ) is controlled based upon the amount of jitter is the only difference in comparison with the processing flowchart of FIG. 25; other processing is executed in the same manner as that of FIG. 22. In accordance with this modification, it is possible to obtain an effect equivalent to that obtained when the distortion compensation coefficient updating interval is controlled based upon the amount of jitter.

What is claimed is:

1. A distortion compensating apparatus having a distortion compensation coefficient calculating unit, to which is input a difference signal between a reference signal that is a transmit signal and a feedback signal, for calculating a distortion compensation coefficient from an adaptive algorithm in such a manner that said difference signal will be diminished, a distortion compensation coefficient memory the stored content of which is updated by the distortion compensation coefficient calculated, and a distortion compensator for applying distortion compensation to the transmit signal based upon said distortion compensation coefficient, comprising:

a phase-difference detector for detecting a phase difference between the reference signal and the feedback signal;

a phase correcting unit for correcting said phase difference; and a controller for exercising control so as to alternately and repeatedly generate a phase correcting interval and a distortion compensation coefficient updating interval, correct said phase difference in said phase correcting interval and update said distortion compensation coefficient in said distortion compensation coefficient updating interval.

2. A distortion compensating apparatus according to claim 1, further comprising a reference signal monitoring unit or a feedback signal monitoring unit for monitoring whether the reference signal or feedback signal is smaller than a set value;

said controller halting updating of the distortion compensation coefficient if the reference signal or feedback signal is smaller than the set value.

3. A distortion compensating apparatus according to claim 1, further comprising a phase-difference monitoring unit for monitoring whether amount of fluctuation between said detected phase difference and a phase difference detected previously is greater than a set value;

said controller halting updating of the distortion compensation coefficient if the amount of fluctuation between the phase differences is greater than the set value.

4. A distortion compensating apparatus according to claim 1, further comprising a distortion compensation coefficient updating interval decision unit for deciding said distortion compensation coefficient updating interval based upon the size of the phase difference between said reference signal and feedback signal;

the distortion compensation coefficient being updated in said distortion compensation coefficient updating interval.

5. A distortion compensating apparatus according to claim 1, further comprising a distortion compensation coefficient updating interval decision unit for deciding said distortion compensation coefficient updating interval based upon the size of the difference signal between said reference signal and feedback signal;

the distortion compensation coefficient being updated in said distortion compensation coefficient updating interval.

6. A distortion compensating apparatus according to claim 1, further comprising:

a power measuring unit for measuring adjacent-channel power; and a distortion compensation coefficient updating interval decision unit for deciding said distortion compensation coefficient updating interval based upon the magnitude of the adjacent-channel power;

the distortion compensation coefficient being updated in said distortion compensation coefficient updating interval.

7. A distortion compensating apparatus according to claim 1, further comprising:

a convergence-state monitoring unit for monitoring state of convergence of the distortion compensation coefficient; and a distortion compensation coefficient updating interval decision unit for deciding said distortion compensation coefficient updating interval based upon the state of convergence;

the distortion compensation coefficient being updated in said distortion compensation coefficient updating interval.

8. A distortion compensating apparatus according to claim 1, further comprising an updating time constant decision unit for deciding an updating time constant of a distortion compensation coefficient in the distortion compensation coefficient calculating unit based upon the size of the phase difference between said reference signal and feedback signal.

9. A distortion compensating apparatus according to claim 1, further comprising an updating time constant decision unit for deciding an updating time constant of a distortion compensation coefficient in the distortion compensation coefficient calculating unit based upon the size of the difference signal between said reference signal and feedback signal.

10. A distortion compensating apparatus according to claim 1, further comprising:

a power measuring unit for measuring adjacent-channel power; and an updating time constant decision unit for deciding an updating time constant of a distortion compensation coefficient in the distortion compensation coefficient calculating unit based upon the magnitude of the adjacent-channel power.

11. A distortion compensating apparatus according to claim 1, further comprising:

a convergence-state monitoring unit for monitoring state of convergence of the distortion compensation coefficient; and an updating time constant decision unit for deciding the updating time constant of a distortion compensation coefficient in the distortion compensation coefficient calculating unit based upon the state of convergence.

* * * * *